(12) United States Patent
Lee et al.

(10) Patent No.: US 7,515,417 B2
(45) Date of Patent: Apr. 7, 2009

(54) APPARATUS FOR COOLING COMPUTER PARTS AND METHOD OF MANUFACTURING THE SAME

(75) Inventors: Sang Cheol Lee, Kyungki-do (KR); Sun Gyu Yoon, Kyungki-do (KR); Sang Jun Jung, Seoul (KR)

(73) Assignee: Zalman Tech Co., Ltd., Seoul (KR)

( * ) Notice: Subject to any disclaimer, the term of this patent is extended or adjusted under 35 U.S.C. 154(b) by 0 days.

(21) Appl. No.: 11/953,086

(22) Filed: Dec. 10, 2007

(65) Prior Publication Data

US 2008/0094798 A1     Apr. 24, 2008

Related U.S. Application Data

(63) Continuation of application No. 11/390,293, filed on Mar. 27, 2006, now abandoned.

(30) Foreign Application Priority Data

Apr. 11, 2005   (KR)   .................. 10-2005-0030118
May 30, 2005   (KR)   .................. 10-2005-0045736

(51) Int. Cl.
*H05K 7/20*   (2006.01)

(52) U.S. Cl. .................. 361/700; 361/699; 257/715; 174/15.2; 165/80.4; 165/104.26

(58) Field of Classification Search ......... 361/694–695, 361/697, 699–704; 165/80.3–80.5, 104.33, 165/185; 174/15.1–15.2, 16.1, 16.3
See application file for complete search history.

(56) References Cited

U.S. PATENT DOCUMENTS 2,434,676 A * 1/1948 Spender ...................... 165/182

| | | | |
|---|---|---|---|
| 5,339,214 A | 8/1994 | Nelson | |
| 5,529,115 A * | 6/1996 | Paterson | ................ 165/104.33 |
| 6,150,809 A | 11/2000 | Tiernan et al. | |

(Continued)

FOREIGN PATENT DOCUMENTS

CN          2490701 Y       5/2002

(Continued)

*Primary Examiner*—Boris L Chervinsky
(74) *Attorney, Agent, or Firm*—Jason Y. Pahng

(57) ABSTRACT

Provided is an apparatus for cooling heat generating computer parts that installed in a computer. The apparatus includes a heat transferring block capable of being thermally coupled to the heat generating parts to conduct the heat generated by the heat dissipating parts; at least one heat pipe, each including a block coupling portion thermally coupled to the heat transferring block and a fin coupling portion formed of a generally curved shape composed essentially of one or more circular arc portions; and a plurality of heat dissipating fins, each having at least one perforation hole. The geometry of the curvature of the entirety of the fin coupling portion is shaped so that the geometry alone would not allow the heat pipe to be inserted through the perforation hole of the heat dissipating fins. The fin coupling portion of the heat pipe passes through each of the at least one perforation hole of the plurality of heat dissipating fins. Each of the heat dissipating fins are spaced apart from one another along the fin coupling portion and positioned to the fin coupling portion.

7 Claims, 43 Drawing Sheets

U.S. PATENT DOCUMENTS

| | | | |
|---|---|---|---|
| 6,295,202 B1 | 9/2001 | Tucker et al. | |
| 6,315,033 B1 * | 11/2001 | Li | 165/104.33 |
| 6,439,298 B1 * | 8/2002 | Li | 165/104.33 |
| 6,640,888 B1 * | 11/2003 | Horng et al. | 165/185 |
| 6,698,499 B1 * | 3/2004 | Wagner et al. | 165/80.3 |
| 6,752,201 B2 * | 6/2004 | Cipolla et al. | 165/121 |
| 6,789,312 B2 * | 9/2004 | White | 29/832 |
| 6,830,098 B1 * | 12/2004 | Todd et al. | 165/104.33 |
| 6,874,565 B2 | 4/2005 | Wagner | |
| 6,988,536 B2 * | 1/2006 | Lee et al. | 165/104.33 |
| 6,992,890 B2 * | 1/2006 | Wang et al. | 361/700 |
| 7,011,147 B1 * | 3/2006 | Hung | 165/104.33 |
| 7,163,050 B2 * | 1/2007 | Wang et al. | 165/104.33 |
| 7,164,582 B2 * | 1/2007 | Hegde | 361/697 |
| 7,249,627 B2 * | 7/2007 | Choi et al. | 165/121 |
| 2002/0017378 A1 * | 2/2002 | Hu | 165/80.3 |
| 2004/0118552 A1 * | 6/2004 | Huang et al. | 165/80.3 |
| 2004/0201958 A1 | 10/2004 | Lev | |
| 2004/0228093 A1 | 11/2004 | Lee | |
| 2005/0068727 A1 | 3/2005 | Yu | |
| 2005/0161199 A1 * | 7/2005 | Ma et al. | 165/104.33 |
| 2006/0185821 A1 * | 8/2006 | Chen | 165/80.3 |
| 2007/0277958 A1 * | 12/2007 | Huang | 165/80.3 |
| 2008/0236798 A1 * | 10/2008 | Zheng et al. | 165/104.33 |

FOREIGN PATENT DOCUMENTS

| | | | |
|---|---|---|---|
| CN | 2498381 Y | | 7/2002 |
| CN | 2622864 Y | | 6/2004 |
| CN | 201018750 Y | * | 2/2008 |
| DE | 202 01 961 U1 | | 5/2002 |
| DE | 202 03 068 U1 | | 7/2003 |
| DE | 202007010951 U1 | * | 11/2007 |
| JP | 2005 093604 A | | 4/2005 |
| KR | 10 0324845 B1 | | 2/2002 |
| KR | 20 0284577 Y1 | | 7/2002 |
| KR | 10 2003 0038144 A | | 5/2003 |
| KR | 10 2004 0047126 A | | 6/2004 |
| KR | 10 2004 0067701 A | | 7/2004 |
| KR | 10 2004 0091171 A | | 10/2004 |
| KR | 10 2005 0021591 A | | 3/2005 |
| KR | 10 2005 0027825 A | | 3/2005 |

* cited by examiner

APPARATUS FOR COOLING COMPUTER PARTS AND METHOD OF MANUFACTURING THE SAME

This application is a continuation of application Ser. No. 11/390,293, filed on Mar. 27, 2006 now abandoned, which claims the benefit of Korean Patent Application Nos. 10-2005-0030118 and 10-2005-0045736, filed on Apr. 11, 2005 and May 30, 2005, respectively, in the Korean Intellectual Property Office, the disclosure of which are incorporated herein in their entirety by reference.

BACKGROUND OF THE INVENTION

1. Field of the Invention

The present invention relates to an apparatus for cooling computer parts, and more particularly, to an apparatus for cooling computer parts, the apparatus comprising a heat pipe including a curved heat dissipating fin coupler and a plurality of heat dissipating fins coupled to the heat dissipating fin coupler so as to cool computer parts that generate heat during operation.

2. Description of the Related Art

Computers comprise heat generating parts such as a central processing unit (CPU) or a chipset mounted on a substrate of a graphic adapter. Such heat generating parts generate a lot of heat when computers are operated. Unless heat is effectively cooled, the temperature of the heat generating parts exceeds a proper temperature, which causes malfunction of or damage to the heat generating parts.

Moreover, since the heat generating parts become more highly integrated and massive, the heat generating parts generate a large amount of heat. Therefore, the heat generating parts require an apparatus for properly and effectively dissipating heat.

To this end, to effectively transfer heat generated by the heat generating parts to heat dissipating members and quickly dissipate the heat externally, attempts to increase the volume of the heat dissipating members and maximize the surface area of the heat dissipating members have been made. As a result, cooling apparatuses having heat dissipating members having a variety of shapes have been introduced, which increases an amount of heat that can be dissipated.

However, even when the volume of the heat dissipating members of such cooling apparatuses is increased, the heat dissipating members are not effectively used to dissipate heat as a whole. More specifically, unless a part of the heat dissipating members is effectively used to dissipate heat, an amount of heat cooled by the heat dissipating members is reduced, requiring more materials for cooling a desired amount of heat. This results in an increase of the weight of the heat dissipating members and their manufacturing cost.

Therefore, a cooling apparatus is required to improve cooling performance per unit weight by effectively using a heat dissipating member in dissipating heat.

SUMMARY OF THE INVENTION

The present invention provides an apparatus having increased cooling performance for cooling computer parts, which has a heat pipe with an improved structure and a plurality of heat dissipating fins coupled to the heat pipe, and a method of manufacturing the same. According to the present invention, an apparatus for cooling heat generating computer parts installed in a computer, the apparatus comprises a heat transferring block capable of being thermally coupled to the heat generating computer parts to conduct the heat generated by the heat generating parts; at least one heat pipe, each including a block coupling portion thermally coupled to the heat transferring block and a fin coupling portion formed of a generally curved shape composed essentially of one or more circular arc portions; and a plurality of heat dissipating fins, each having at least one perforation hole; wherein the geometry of the curvature of the entirety of the fin coupling portion is shaped so that the geometry alone would not allow the heat pipe to be inserted through the perforation hole of the heat dissipating fins; wherein the fin coupling portion of the heat pipe passes through each of the at least one perforation hole of the plurality of heat dissipating fins; wherein each of the heat dissipating fins are spaced apart from one another along the fin coupling portion and positioned to the fin coupling portion.

BRIEF DESCRIPTION OF THE DRABLADES

The above and other features and advantages of the present invention will become more apparent by describing in detail exemplary embodiments thereof with reference to the attached drawings in which.

Figure 1:
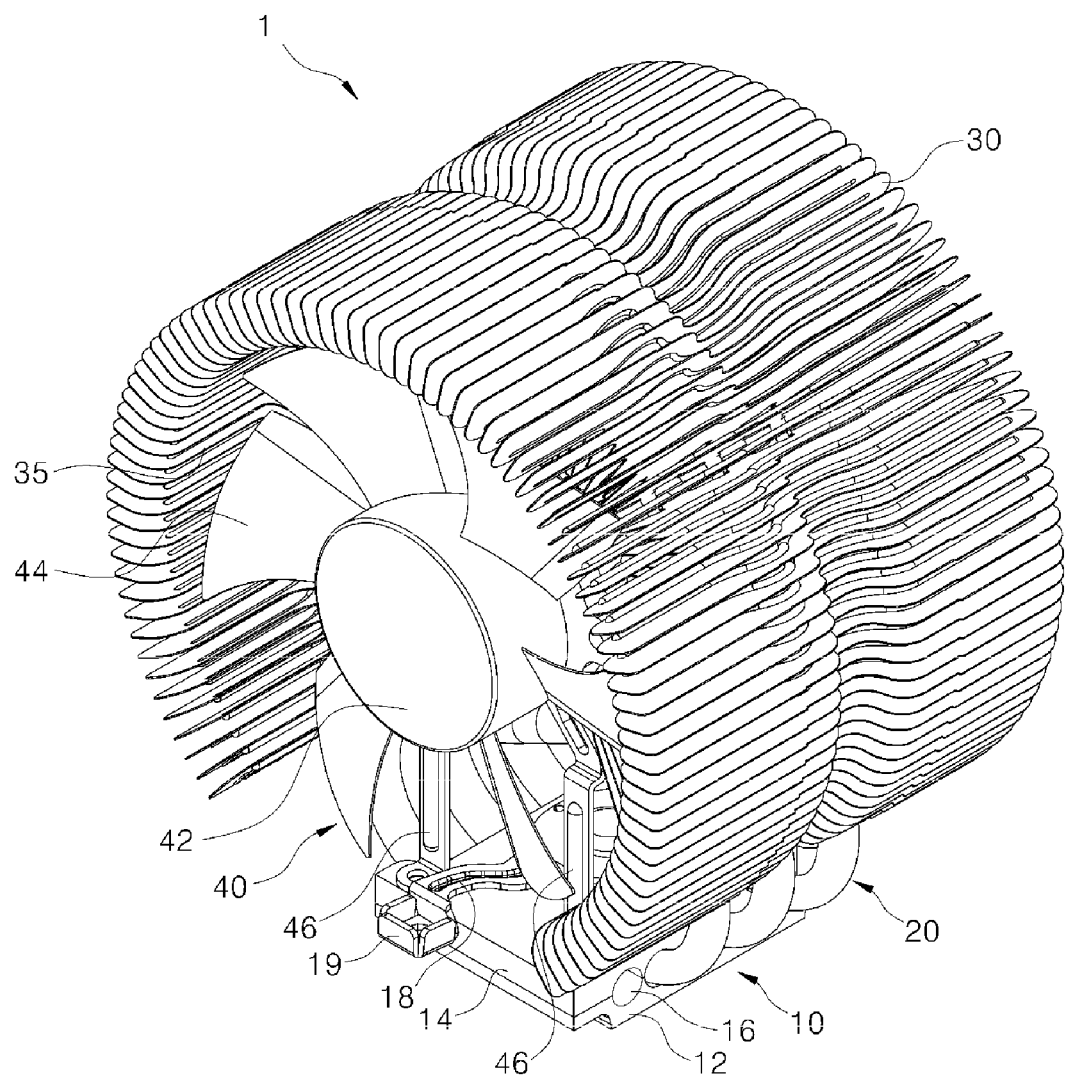
FIG. 1 is a perspective view of an apparatus for cooling computer parts according to an embodiment of the present invention.
Figure 2:
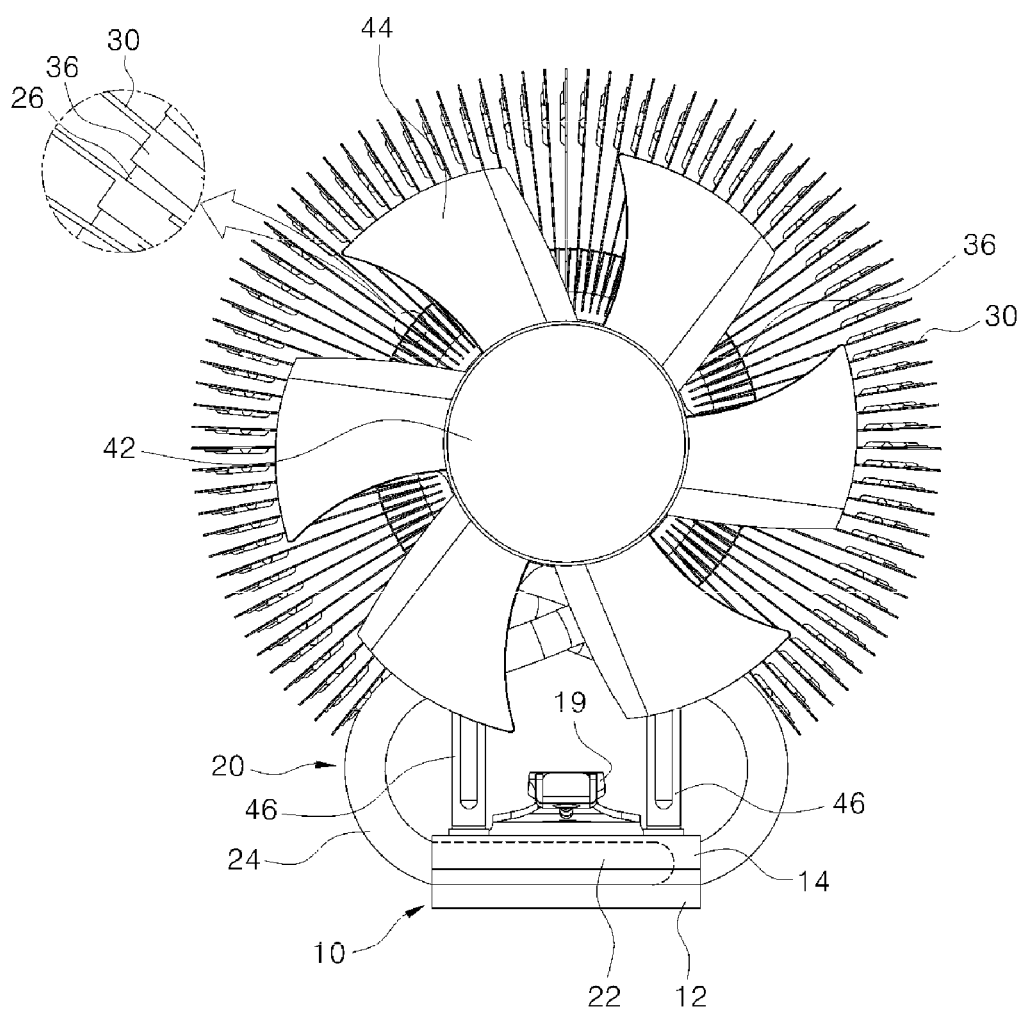
Figure 3:
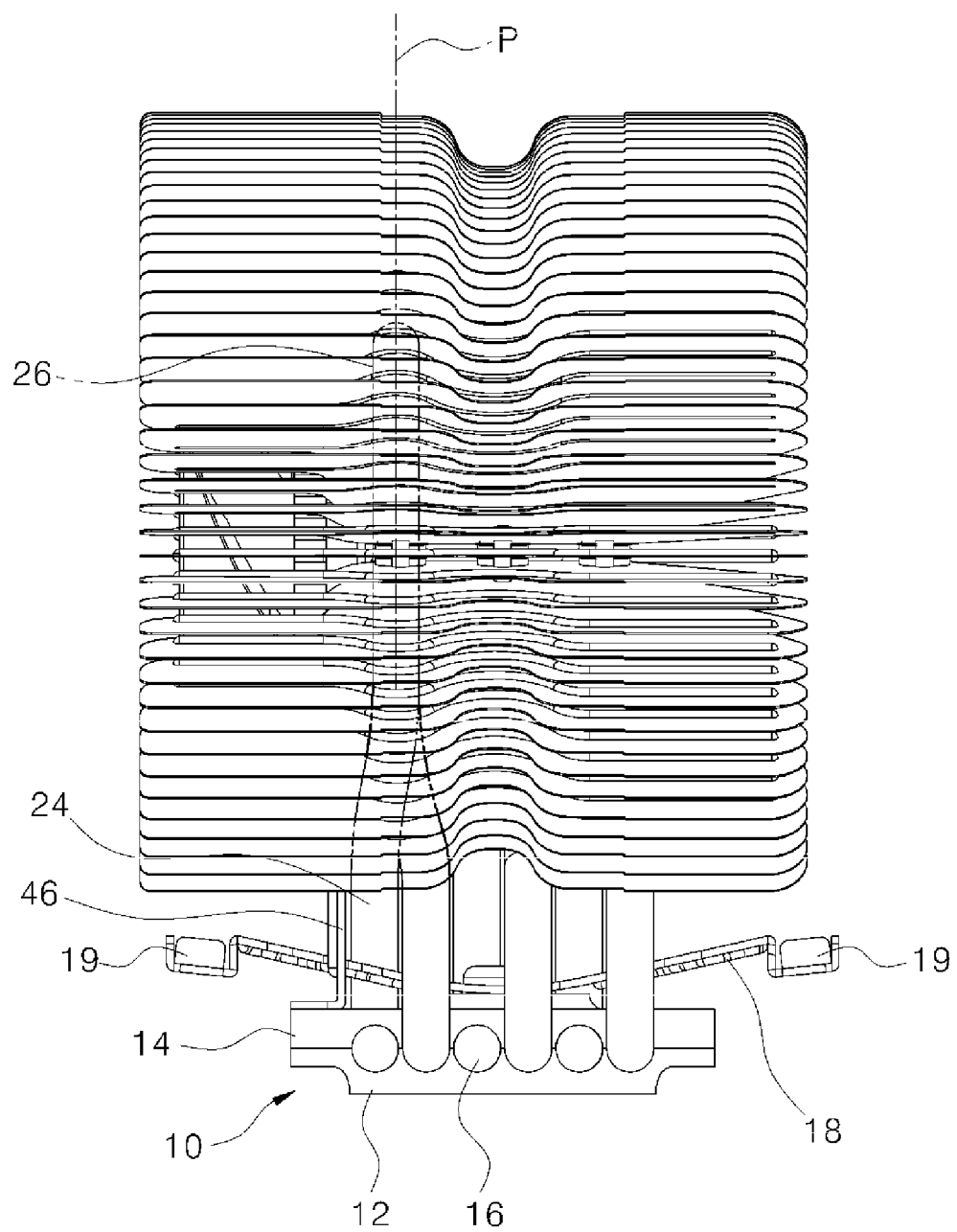
Figure 4:
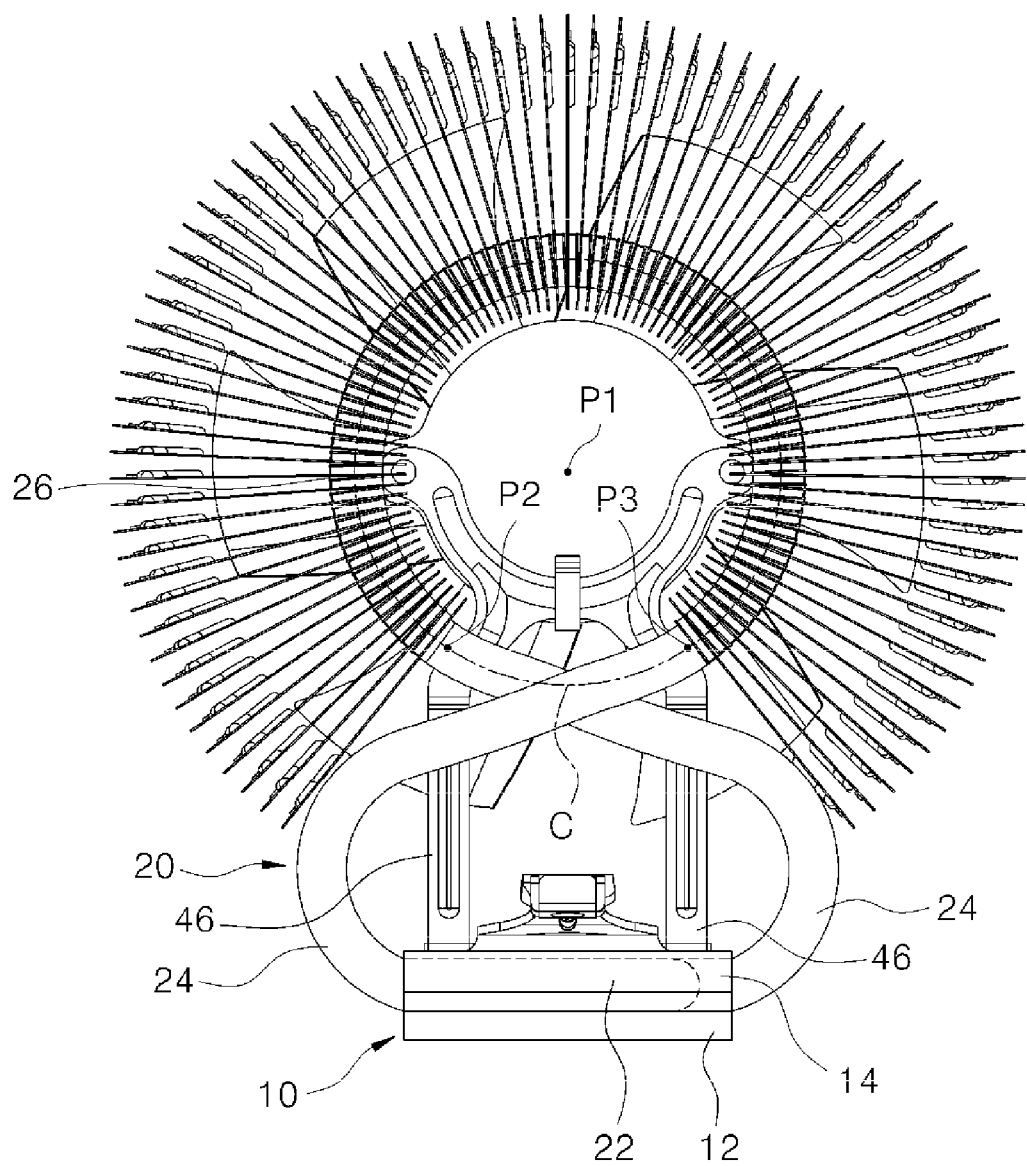
Figure 5A:
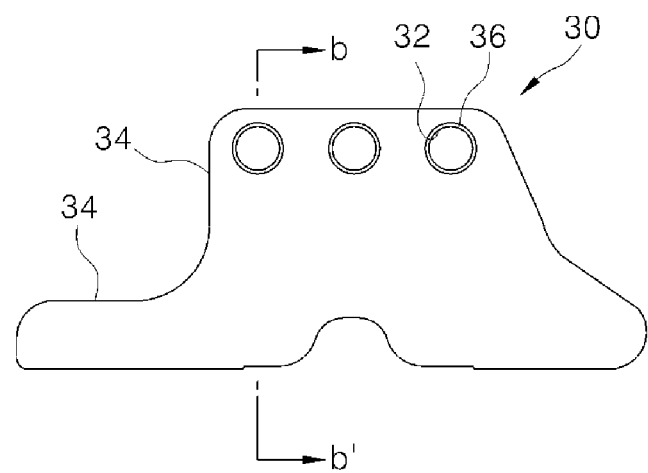
Figure 5B:
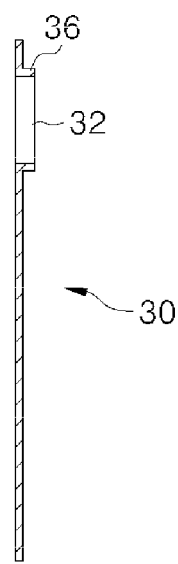
Figure 6:
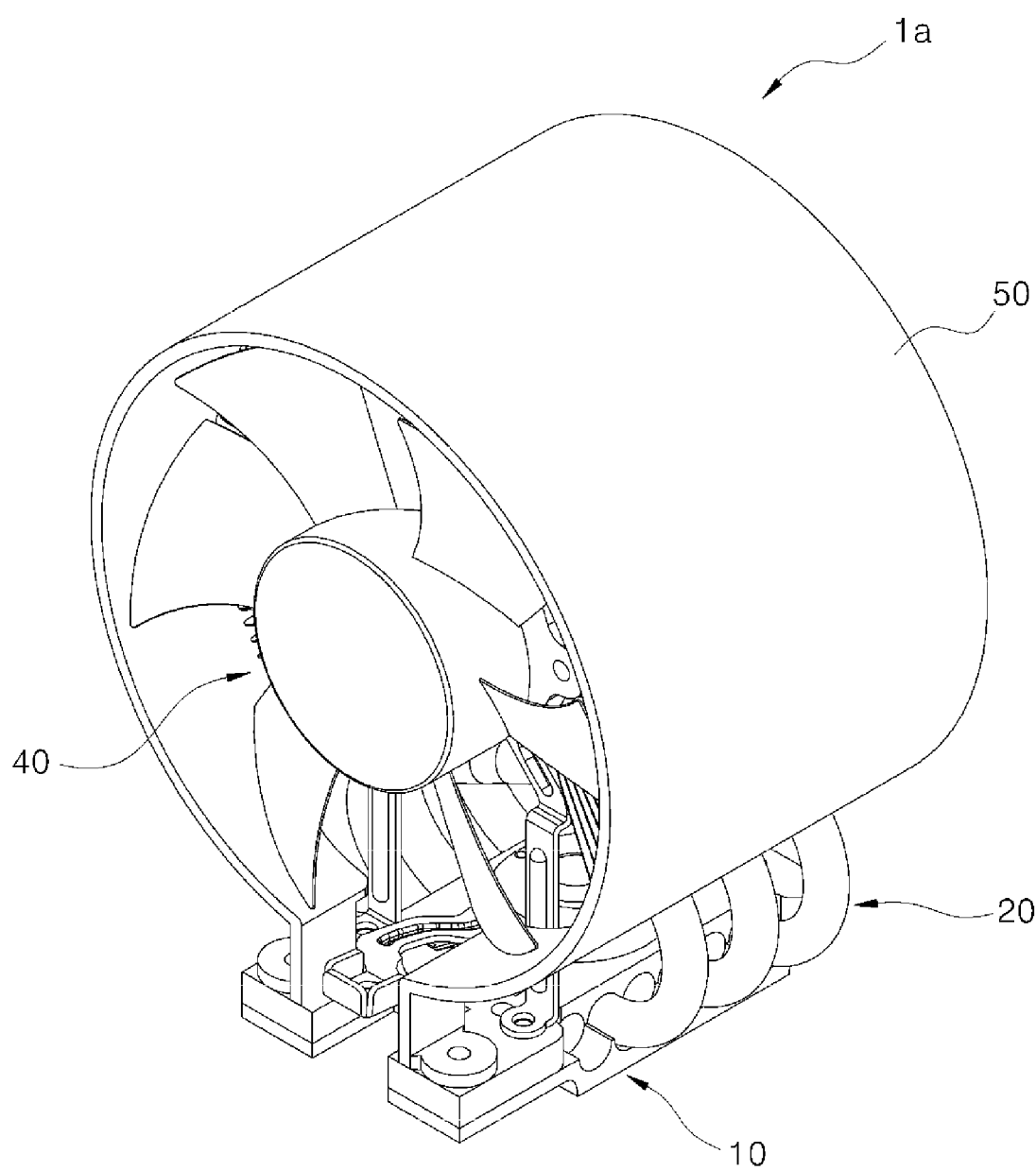
Figure 7:
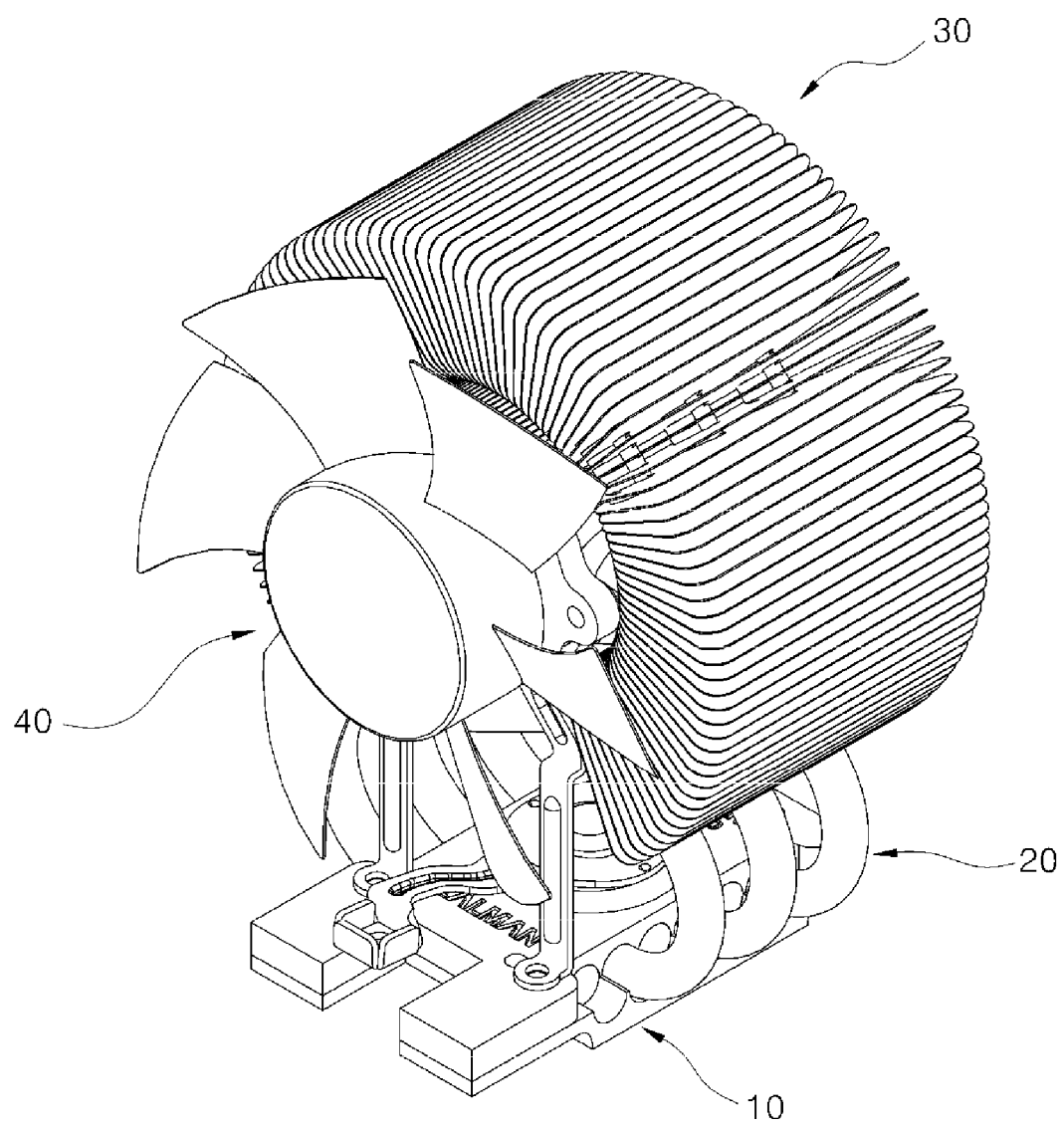
Figure 8:
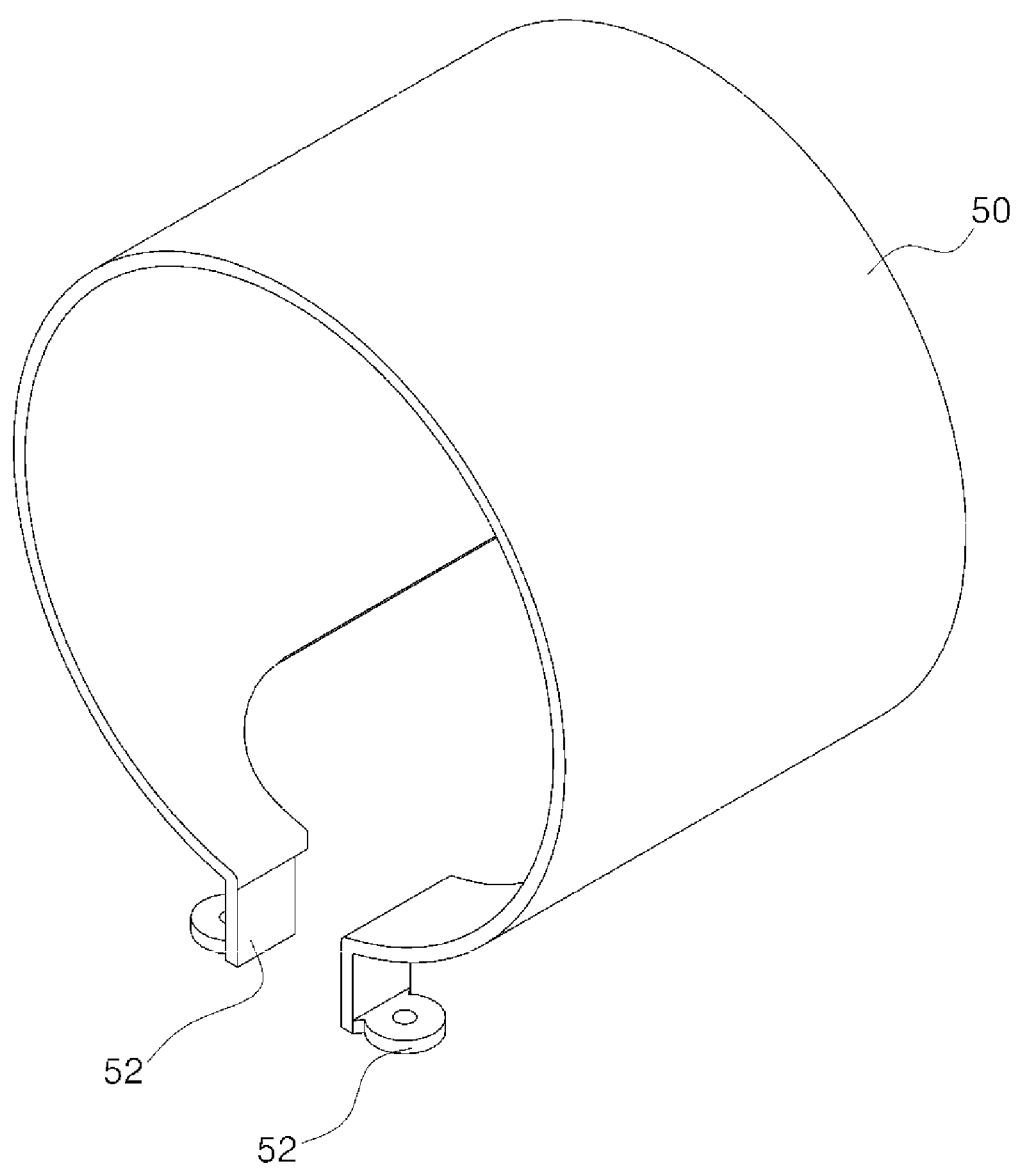
Figure 9:
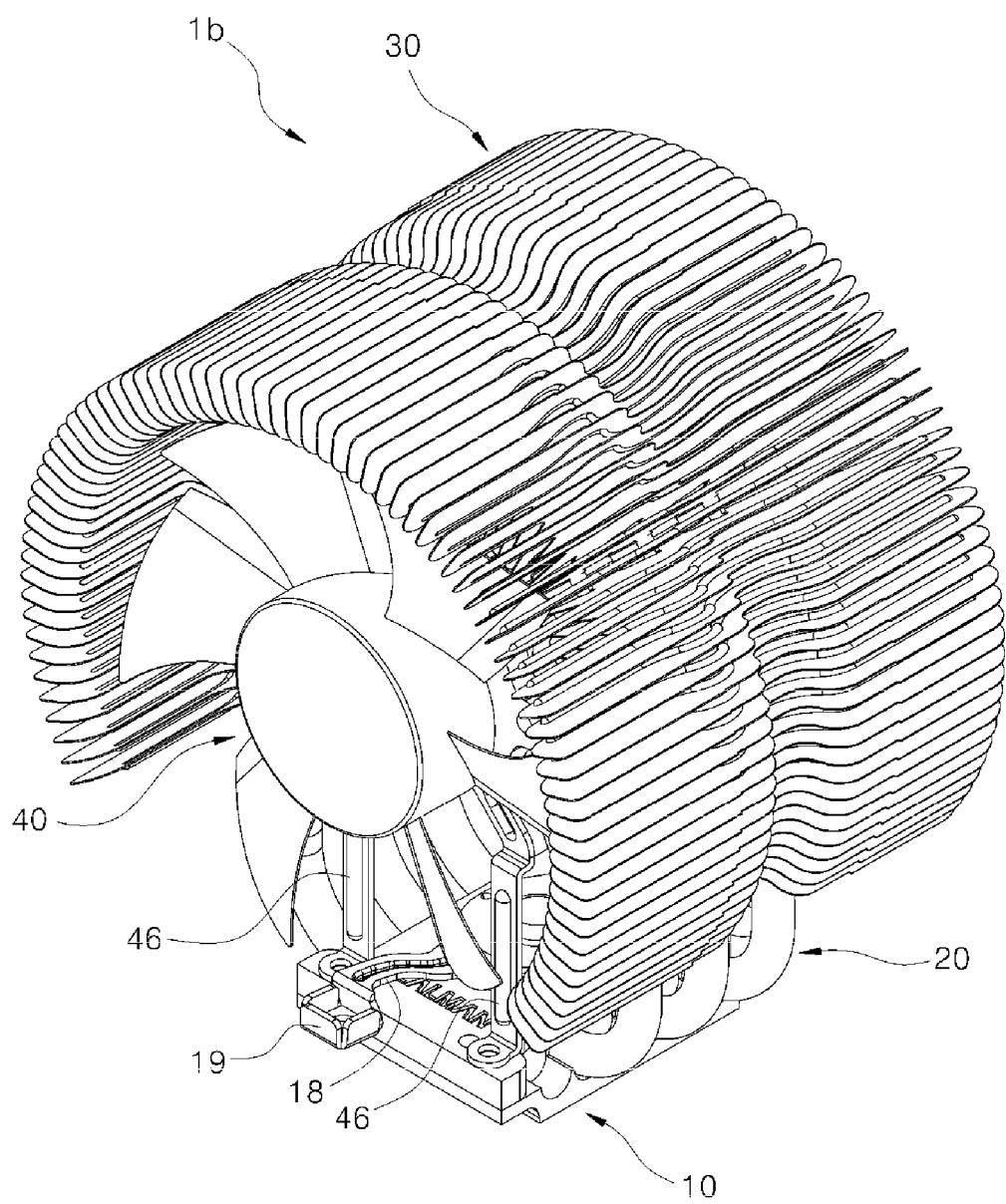
Figure 9A:
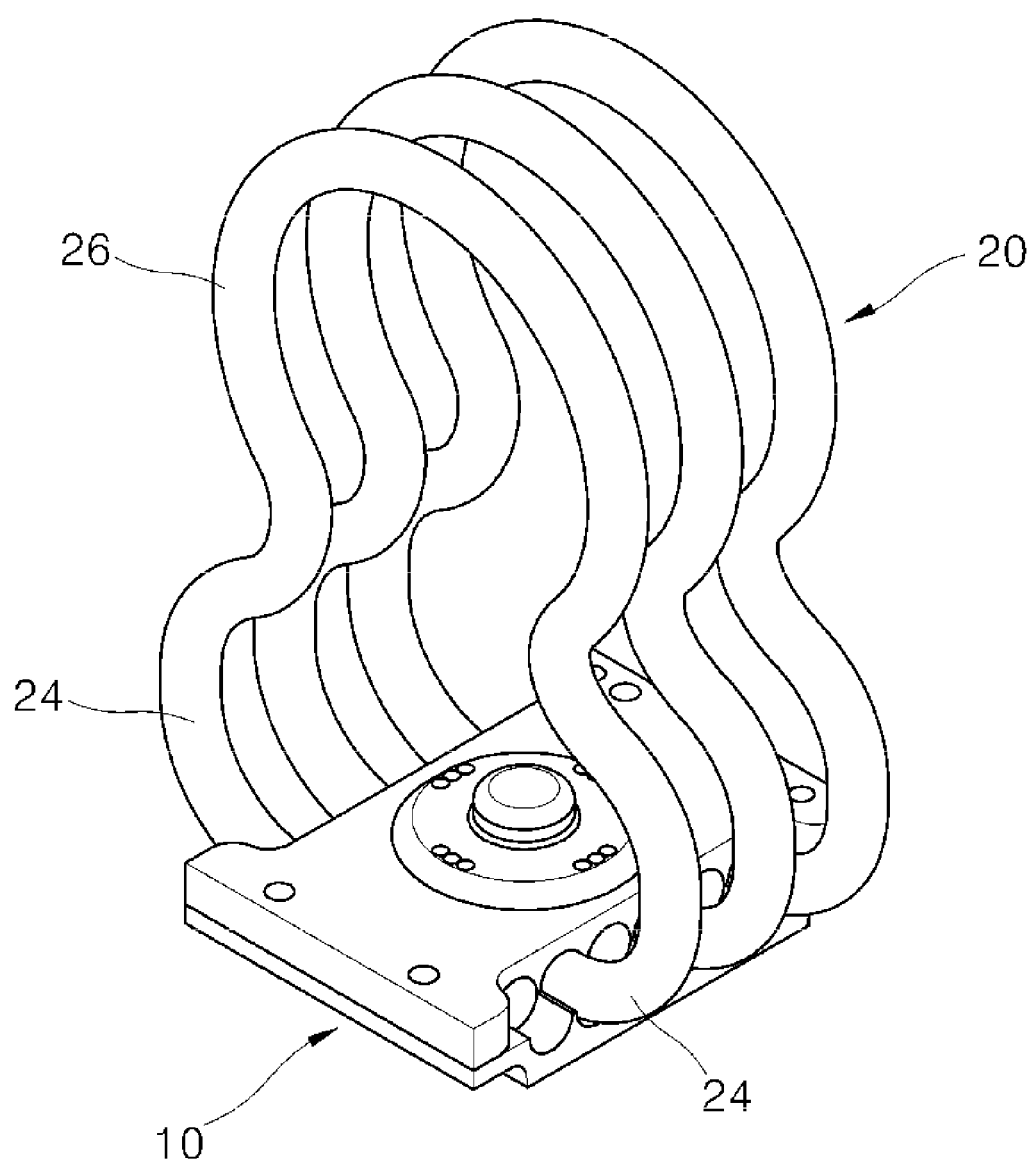
Figure 10:
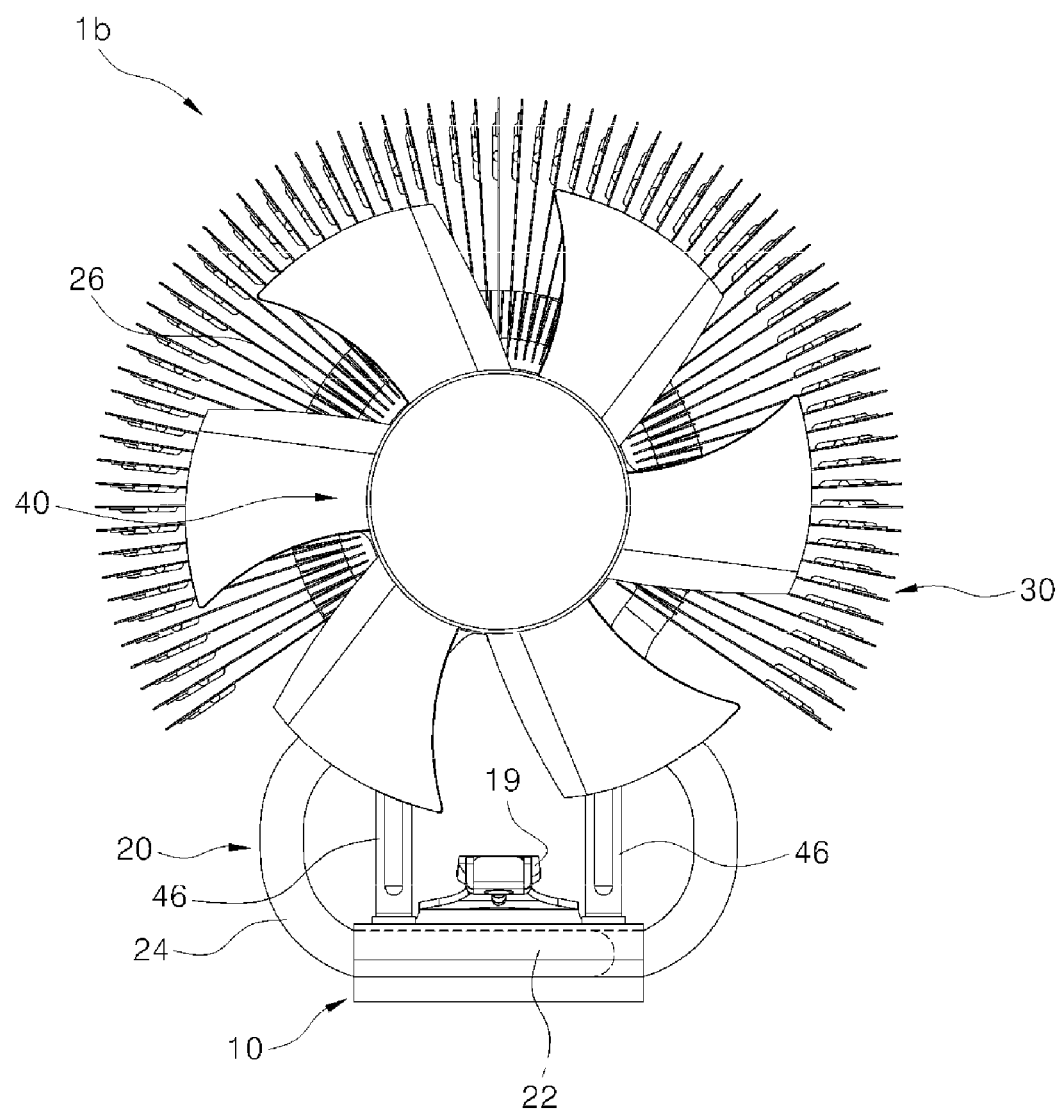
Figure 11:
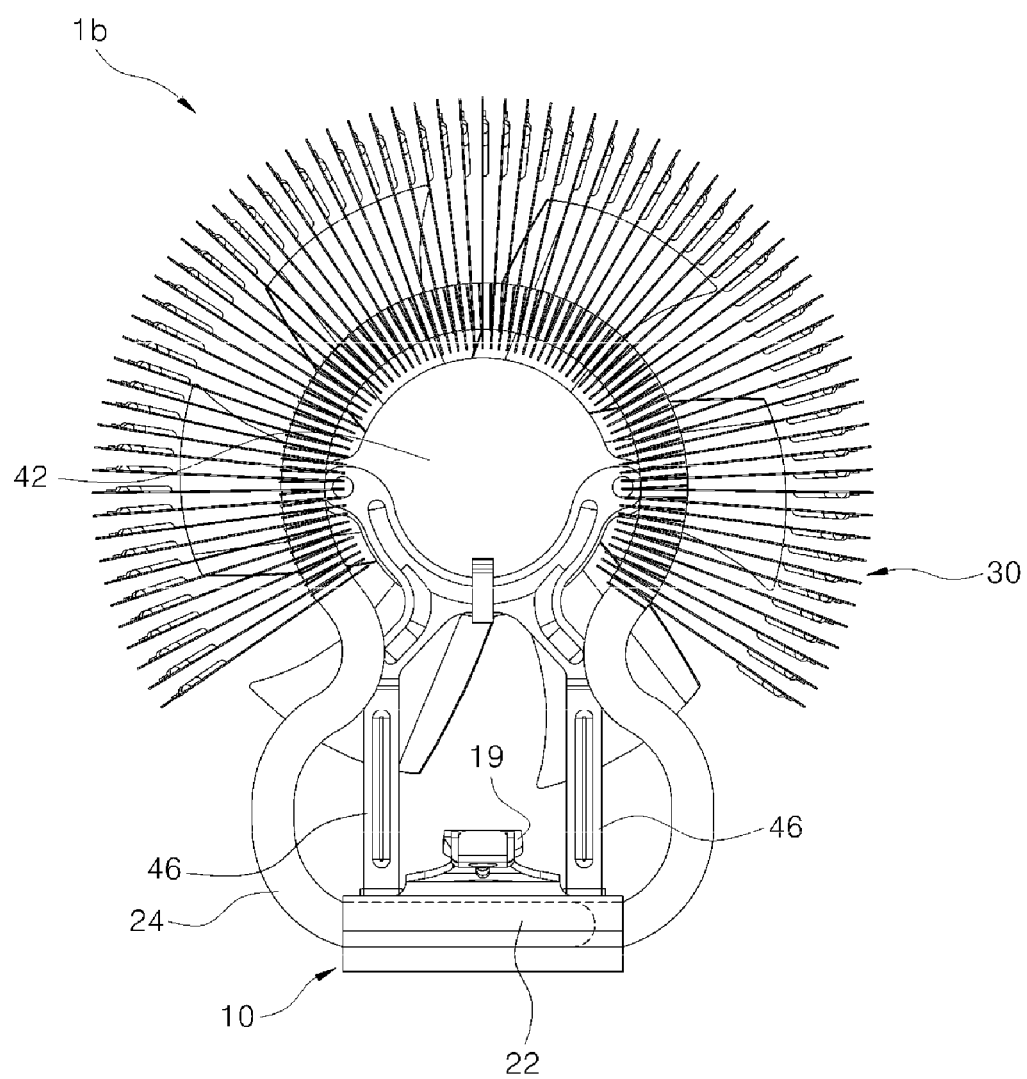
Figure 12:
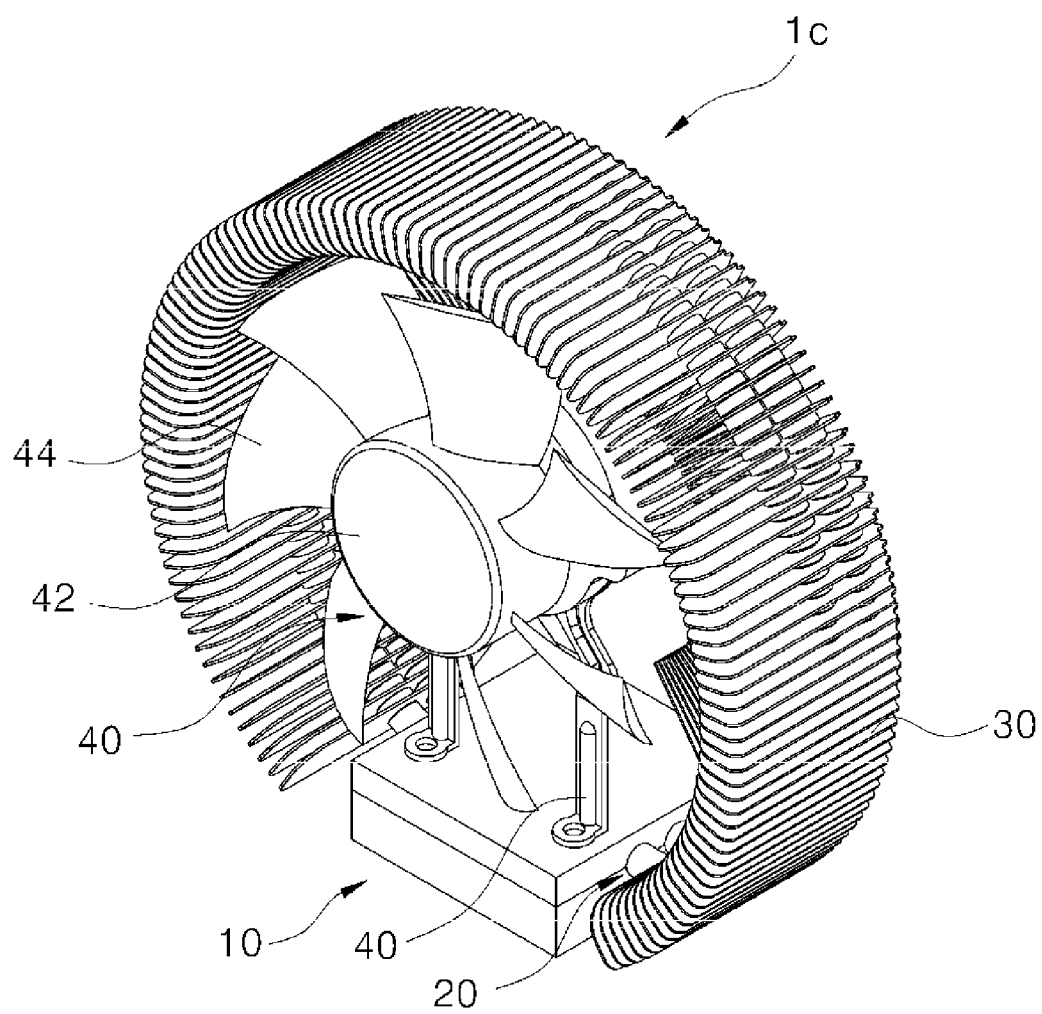
Figure 12A:
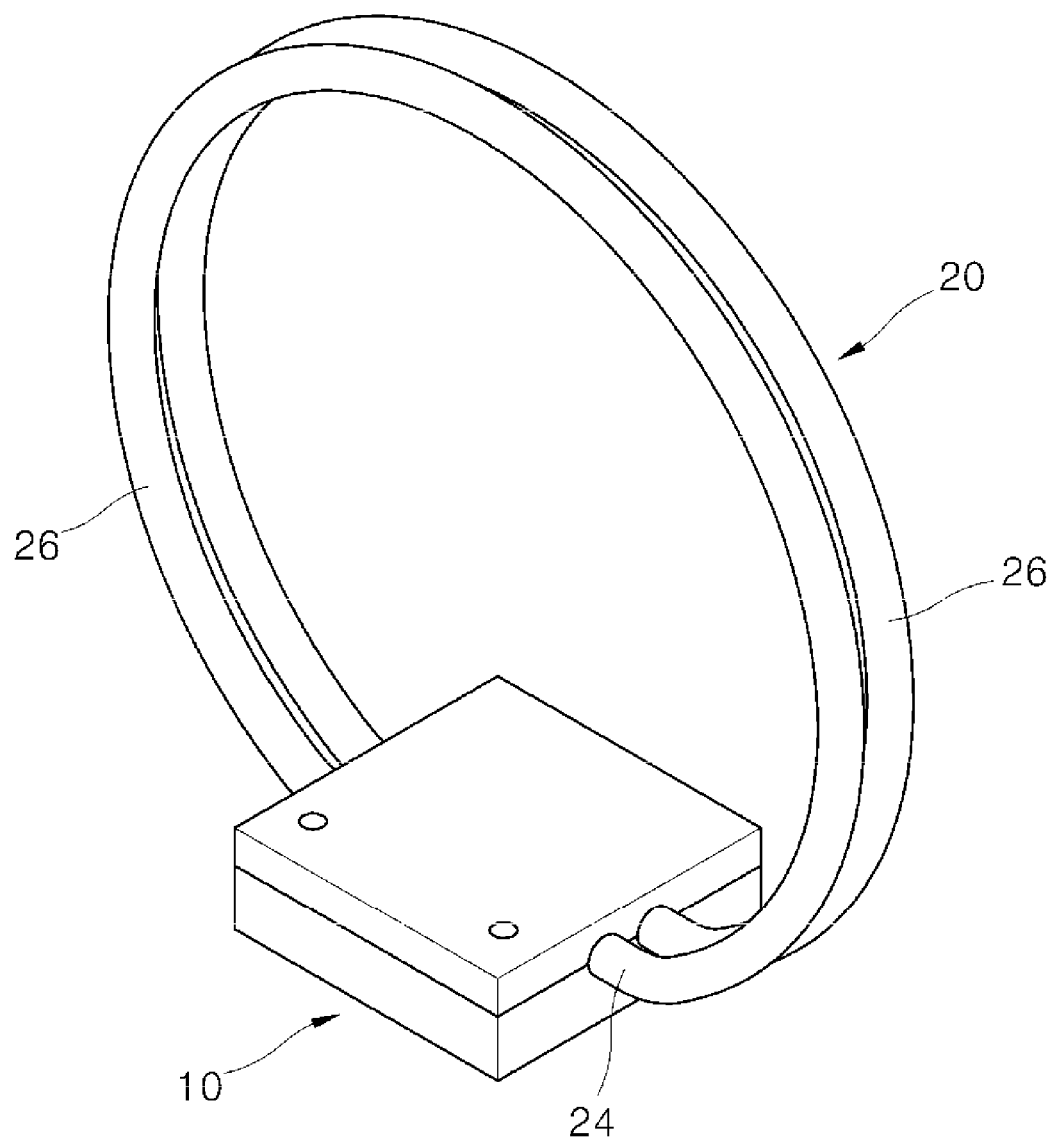
Figure 13:
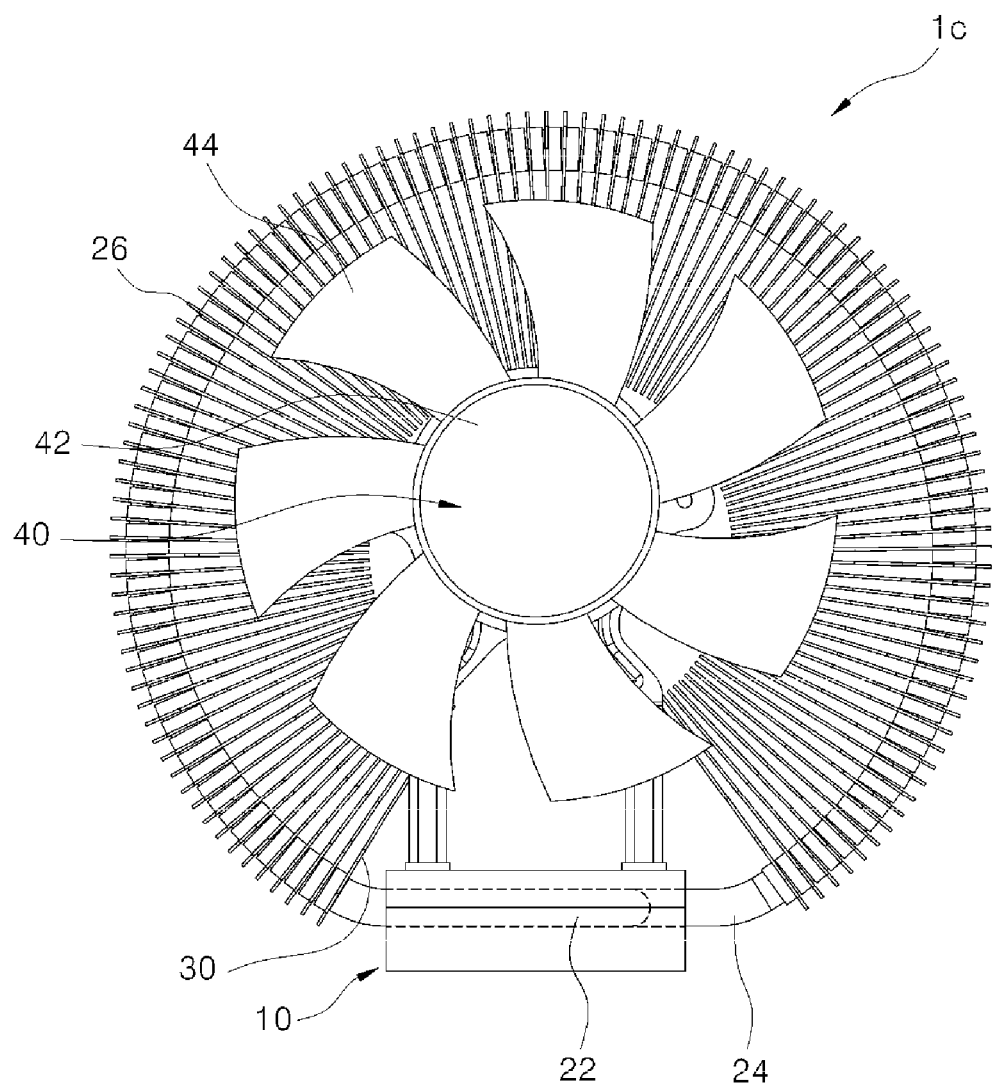
Figure 14:
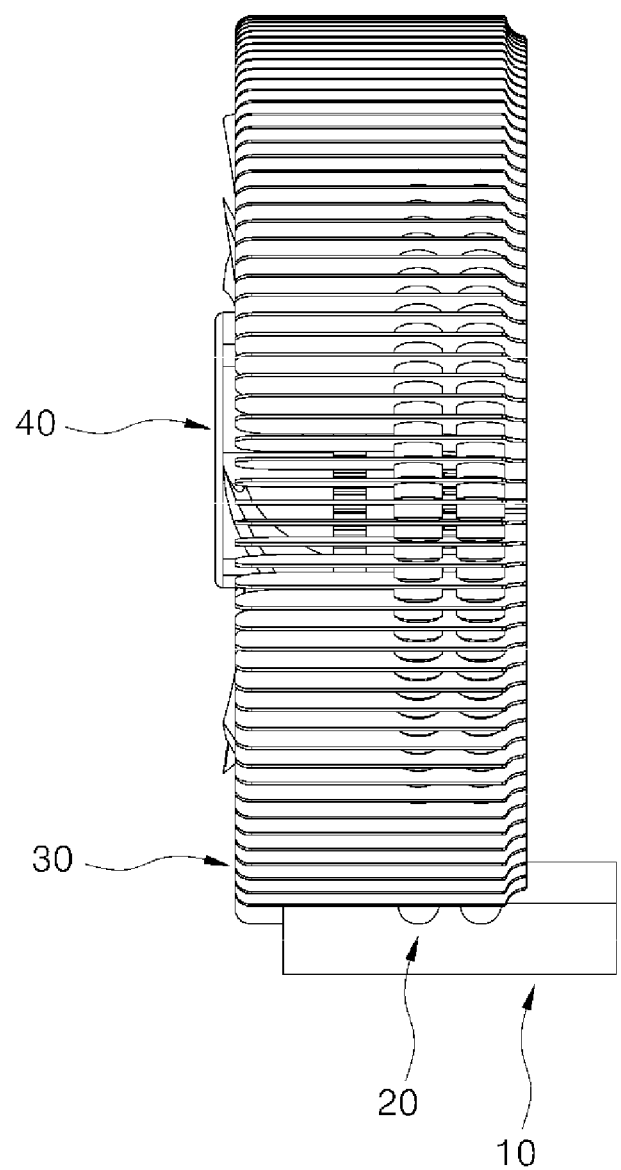
Figure 15:
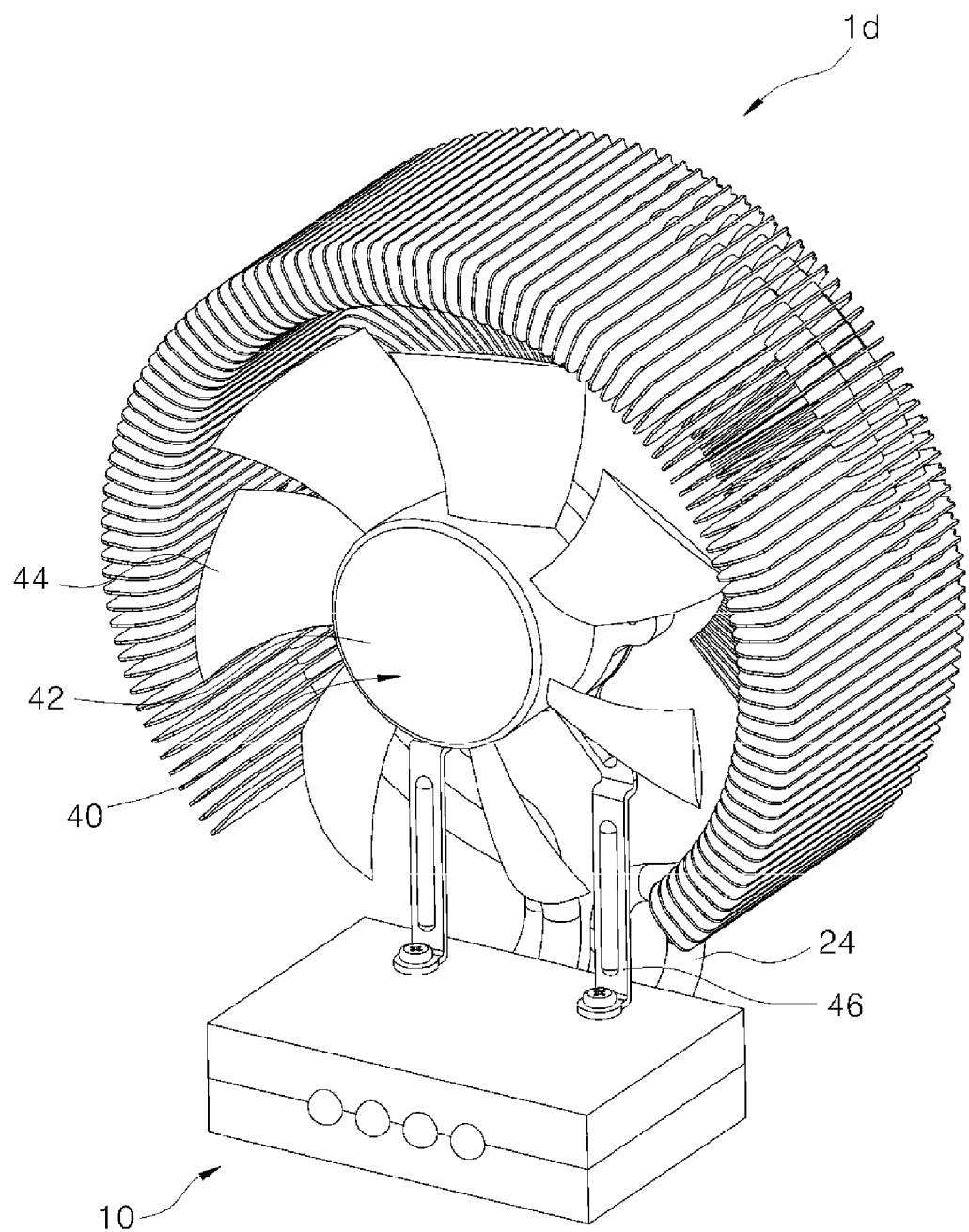
Figure 15A:
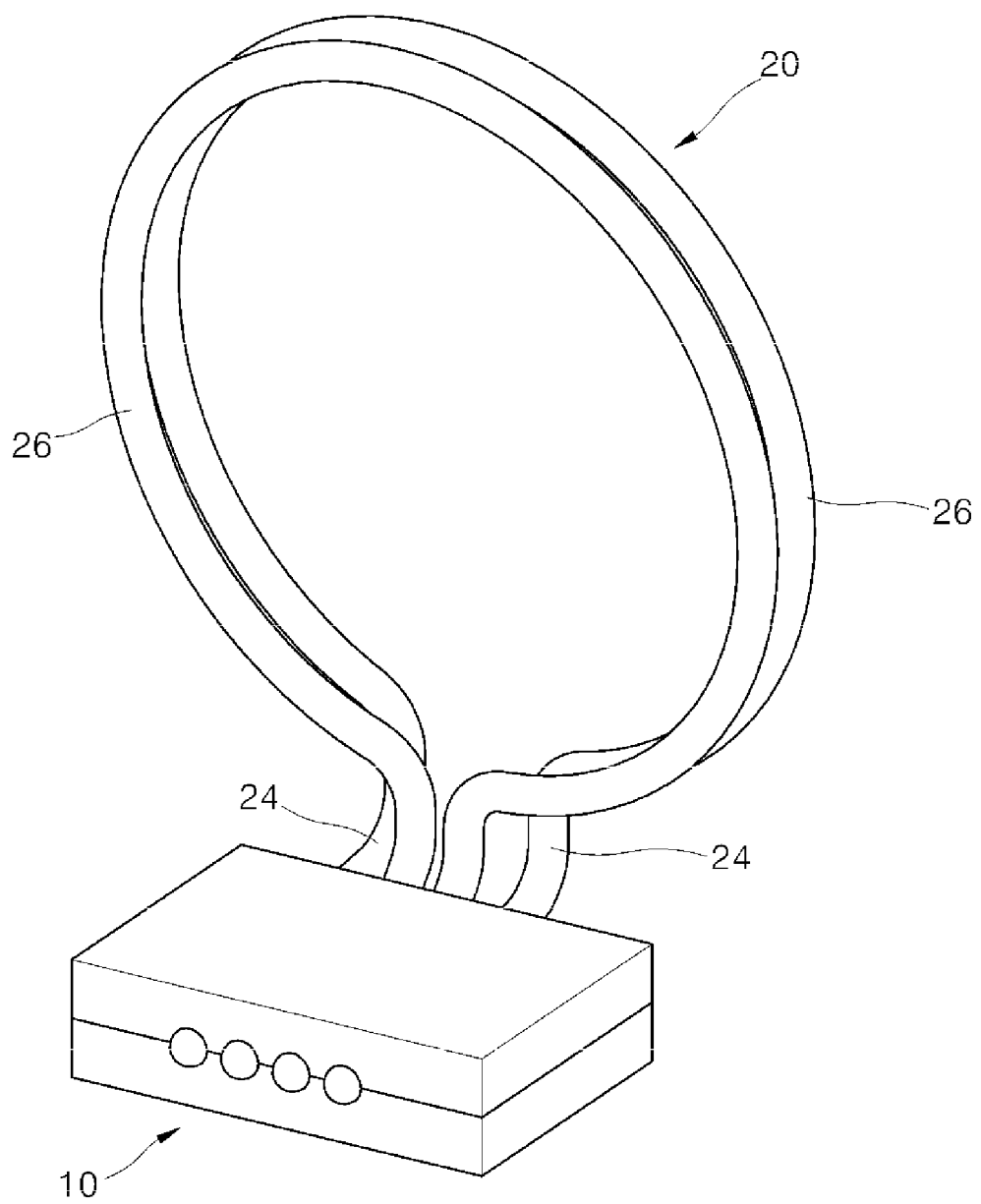
Figure 16:
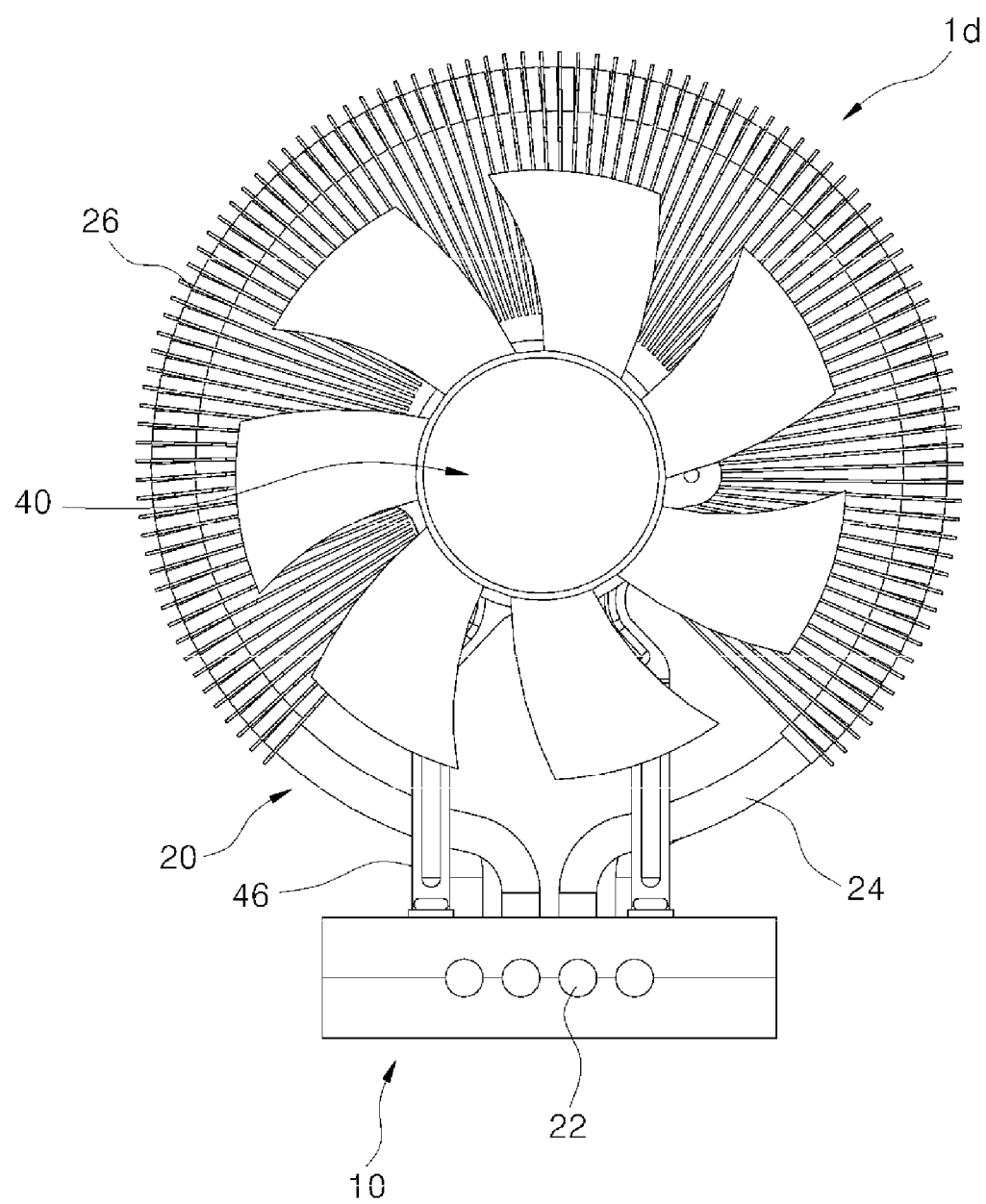
Figure 17:
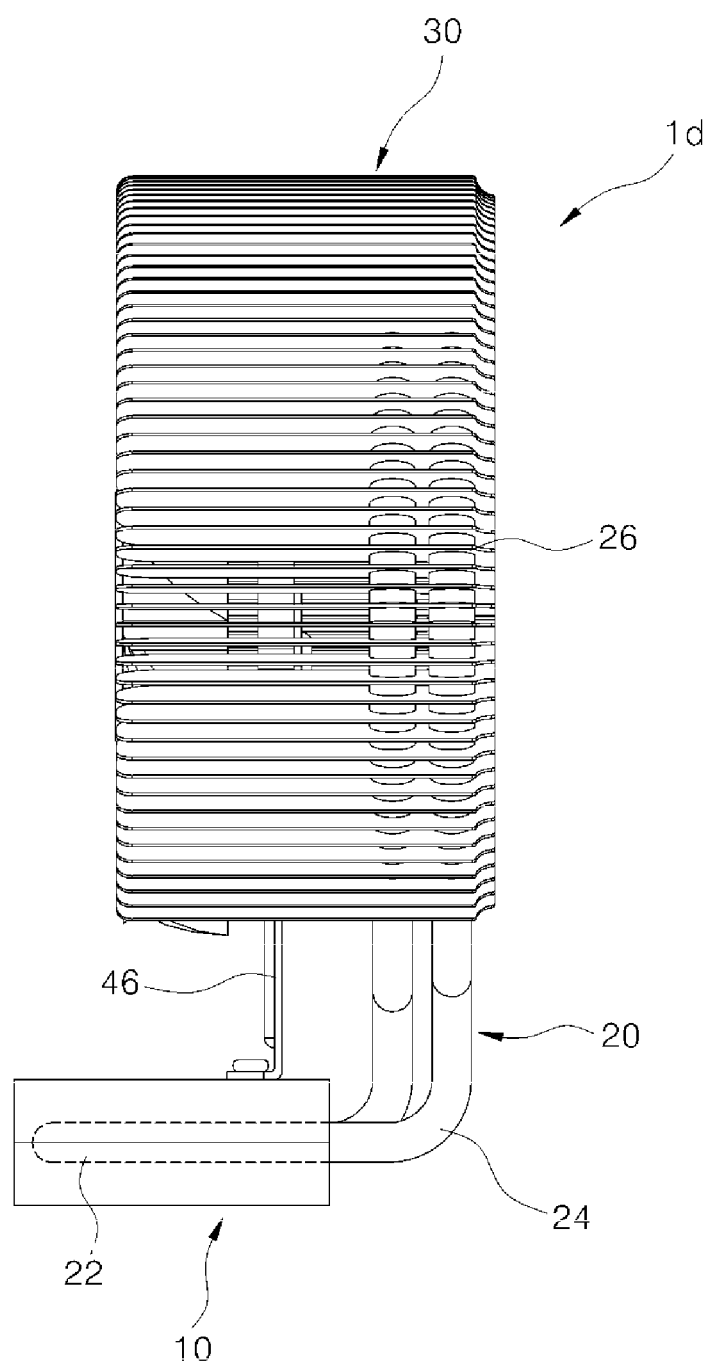
Figure 18:
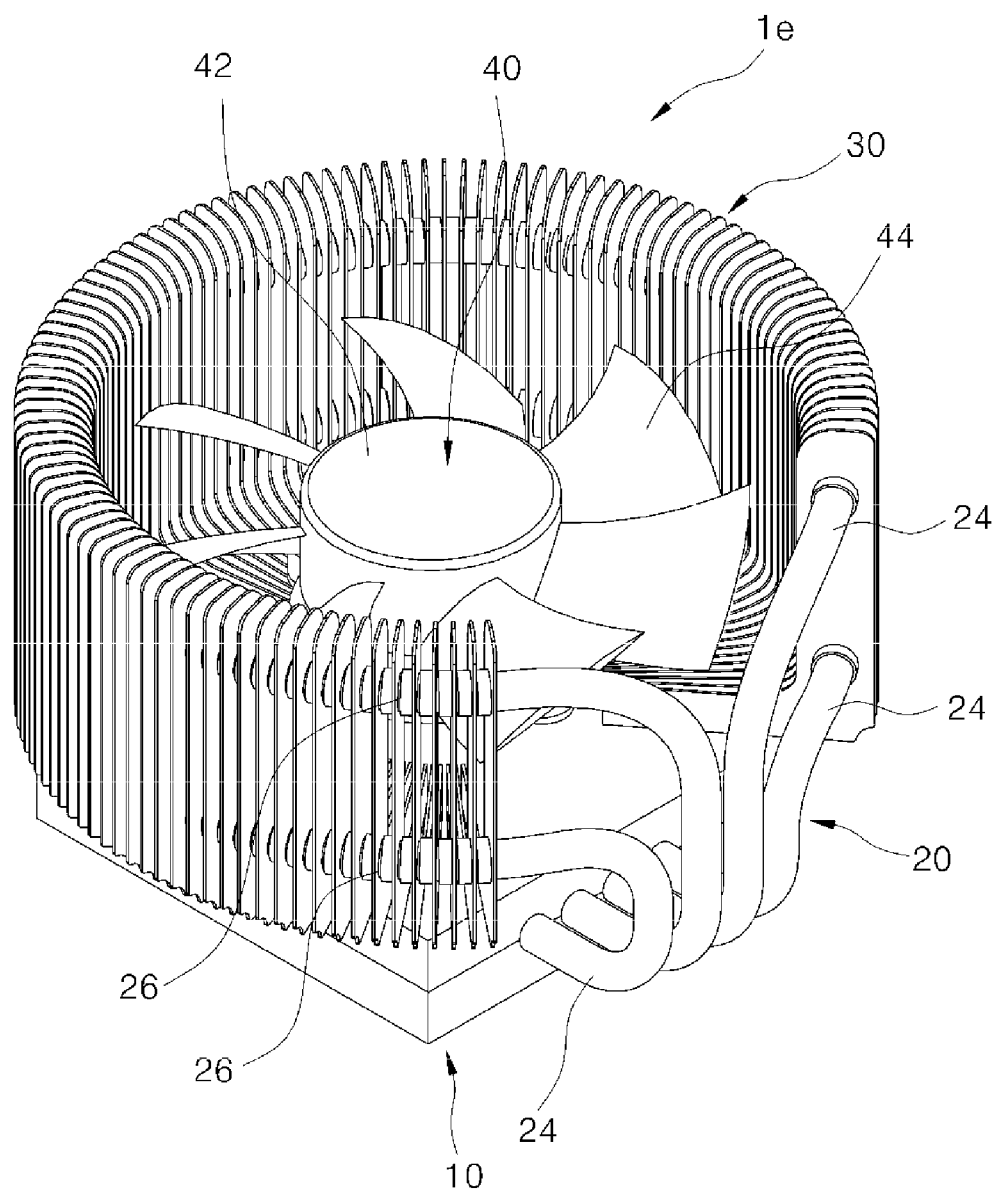
Figure 18A:
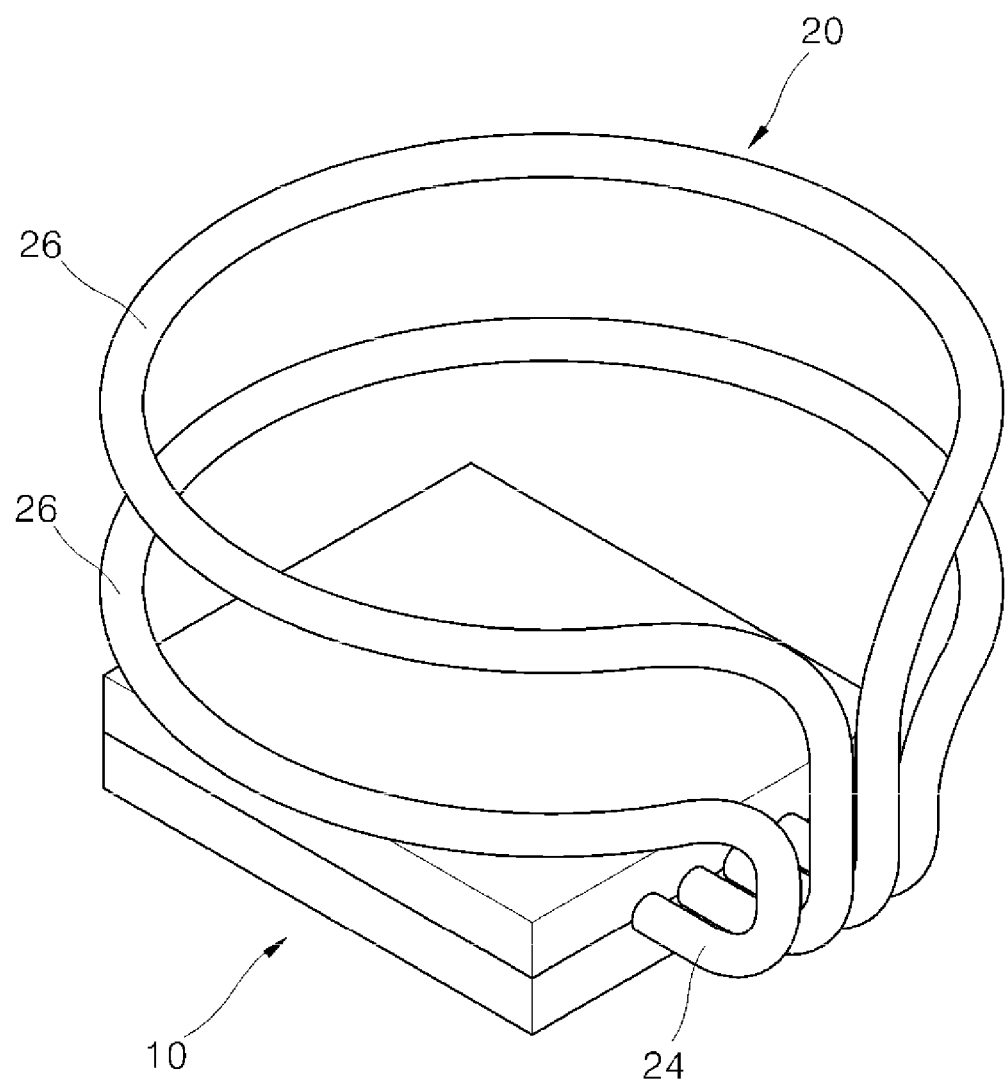
Figure 19:
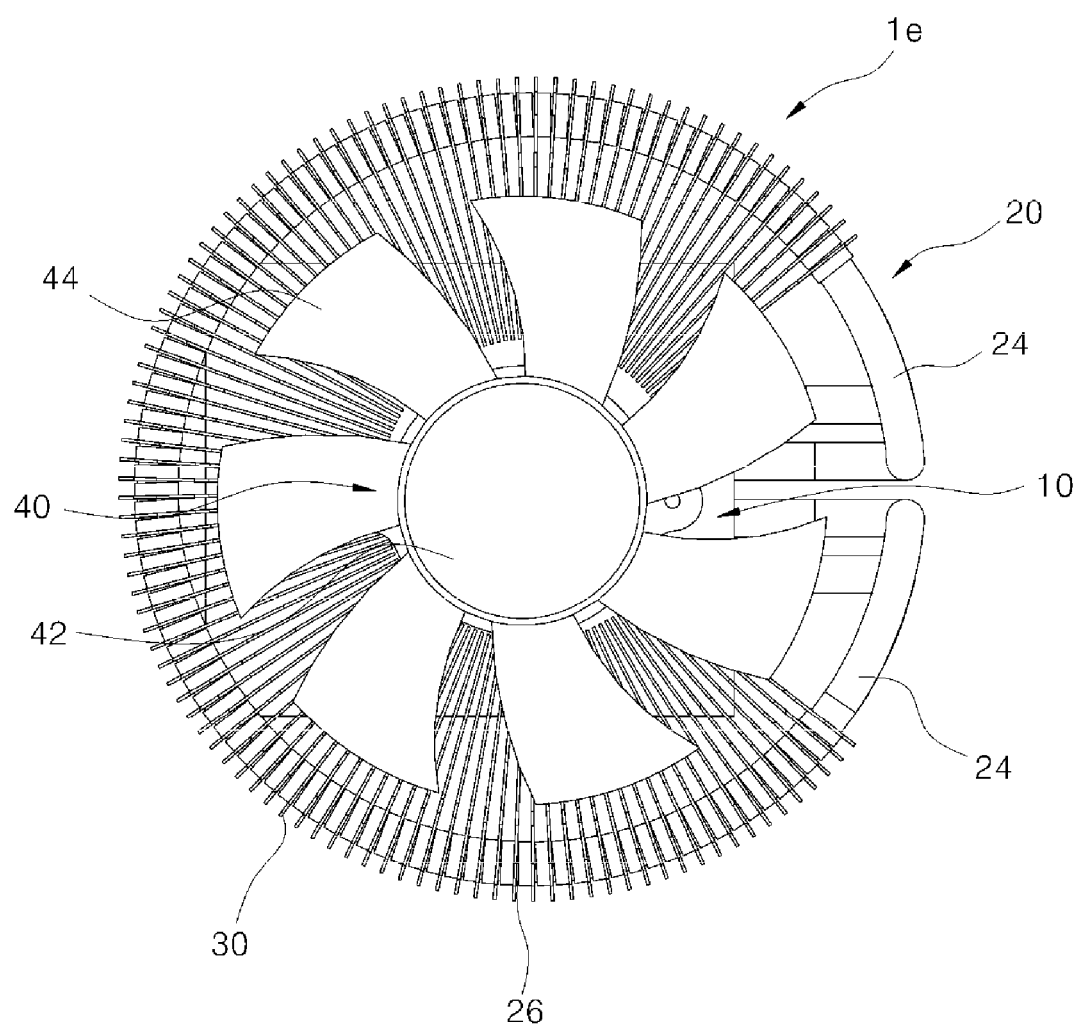
Figure 20:
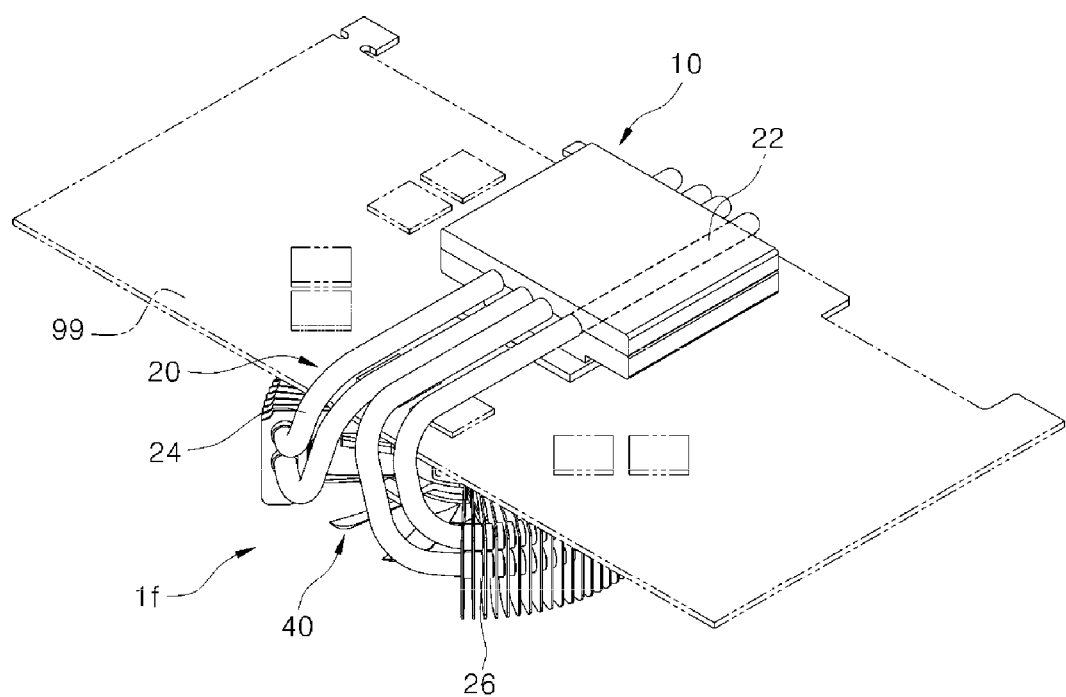
Figure 21:
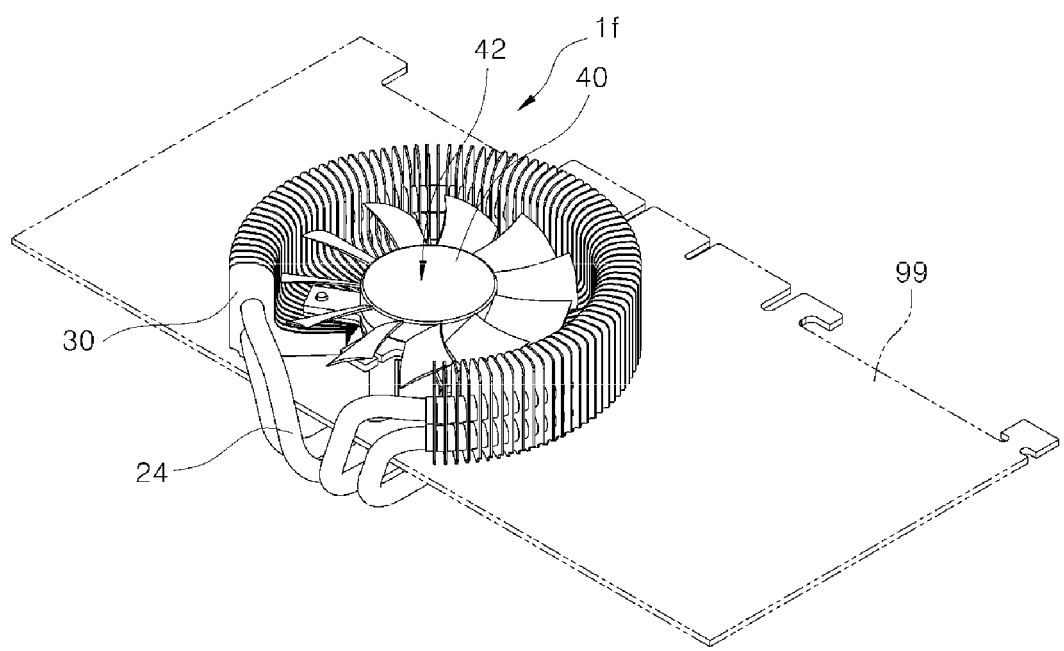
Figure 21A:
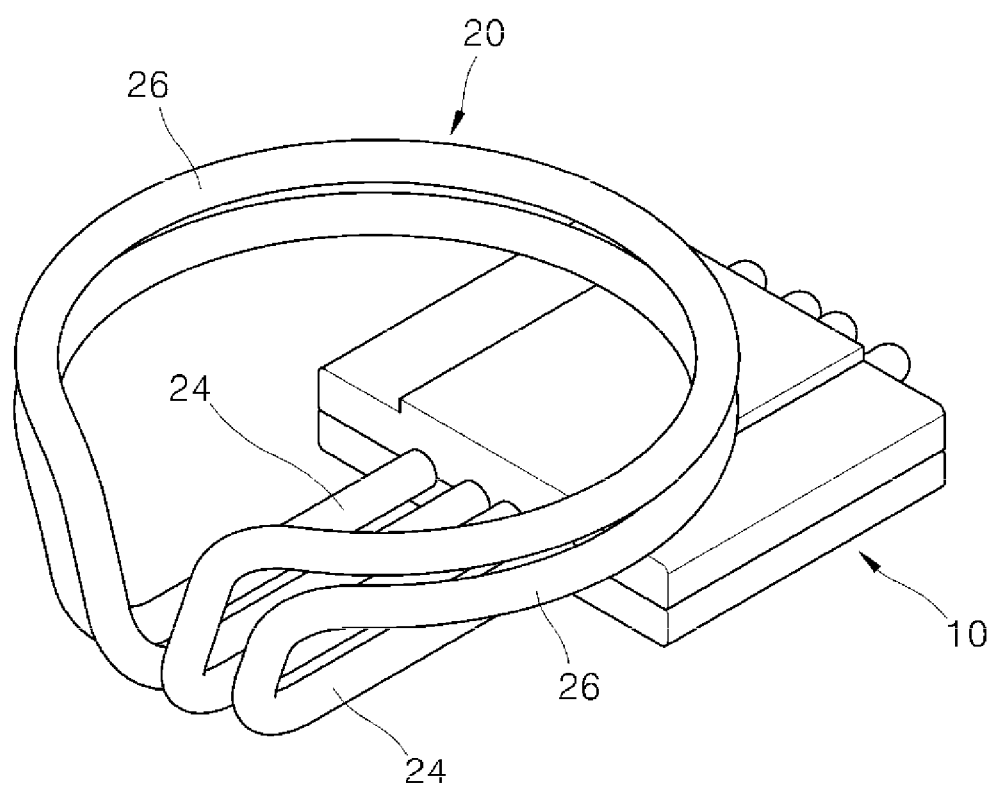
Figure 22:
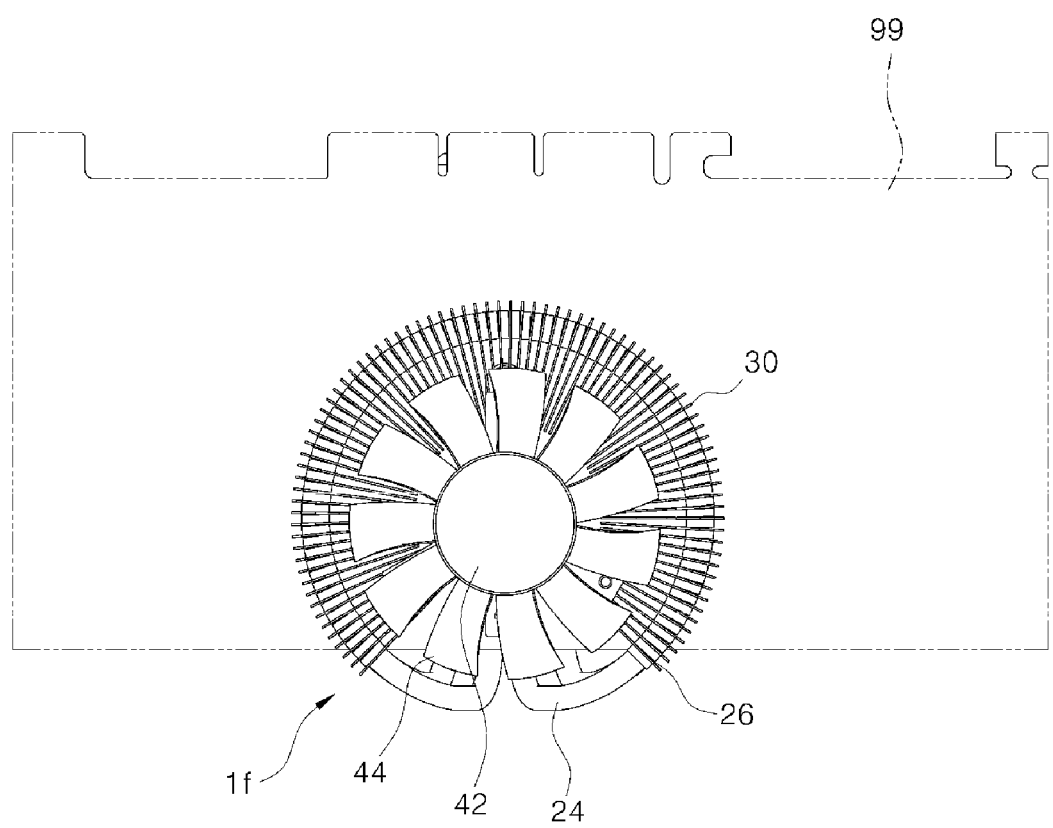
Figure 23:
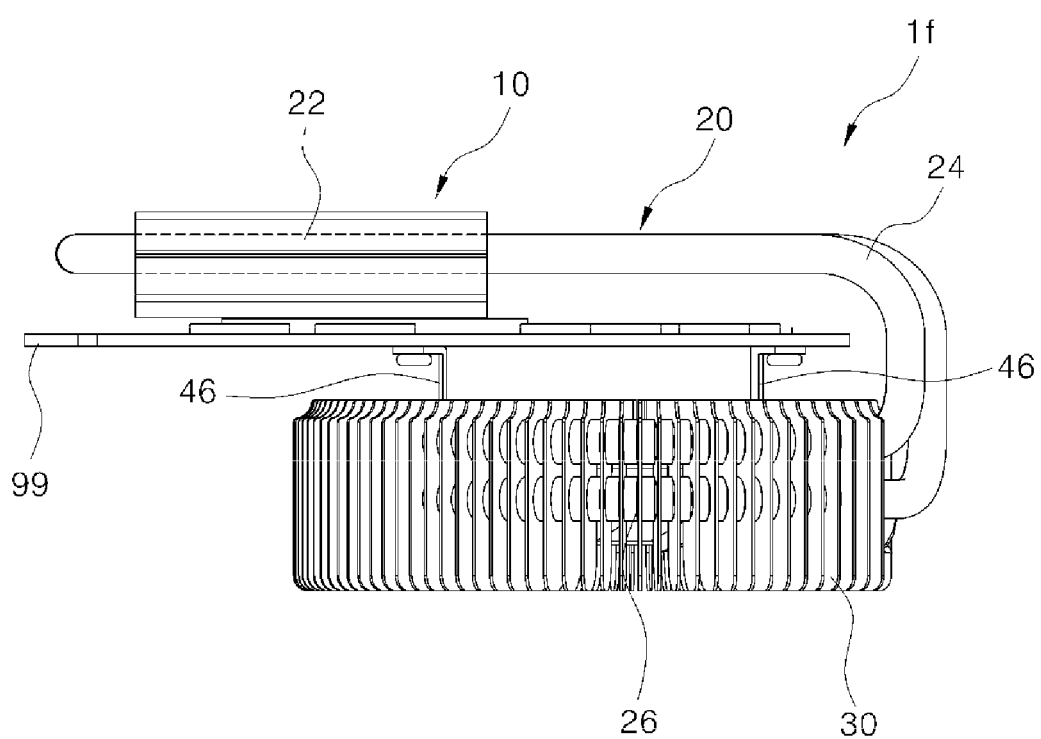
Figure 24:
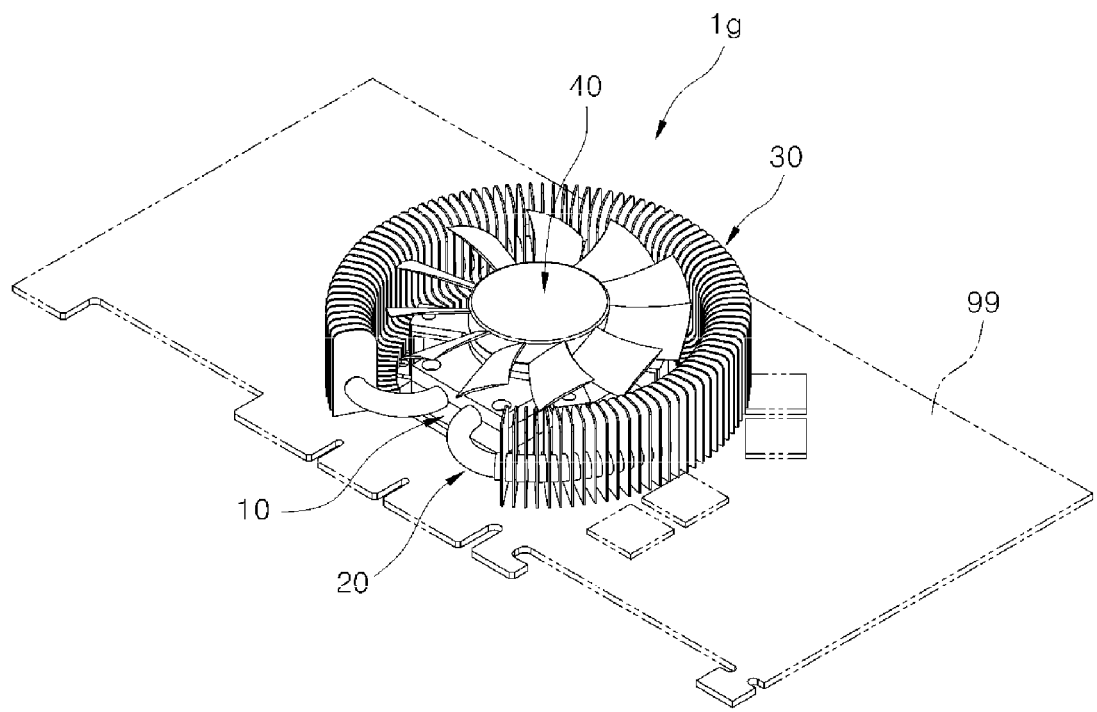
Figure 24A:
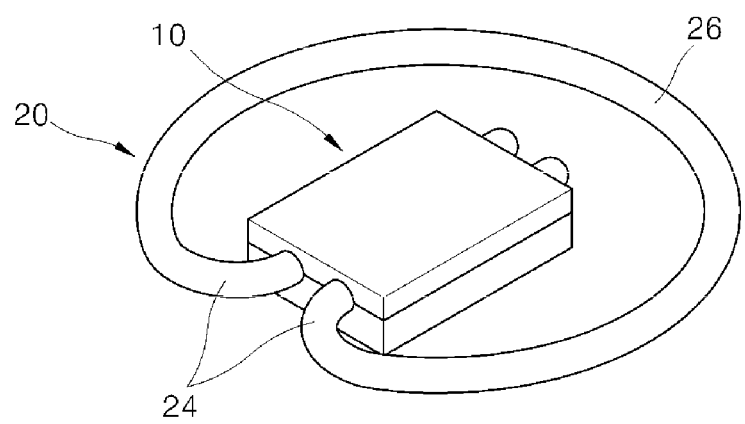
Figure 25:
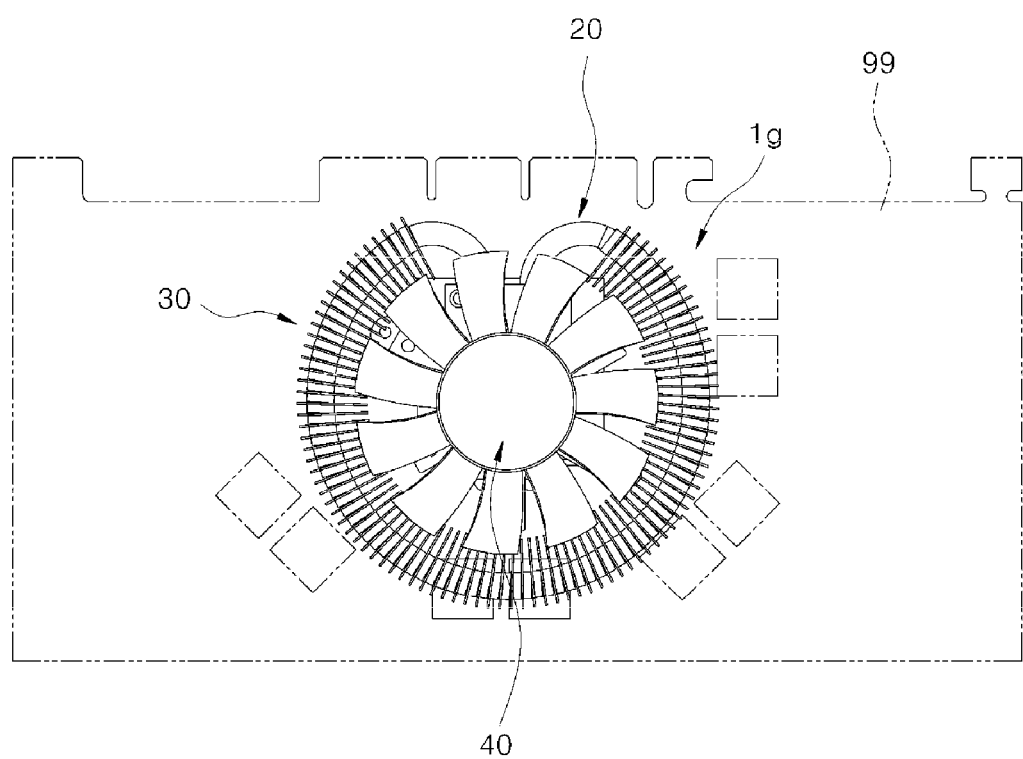
Figure 26:
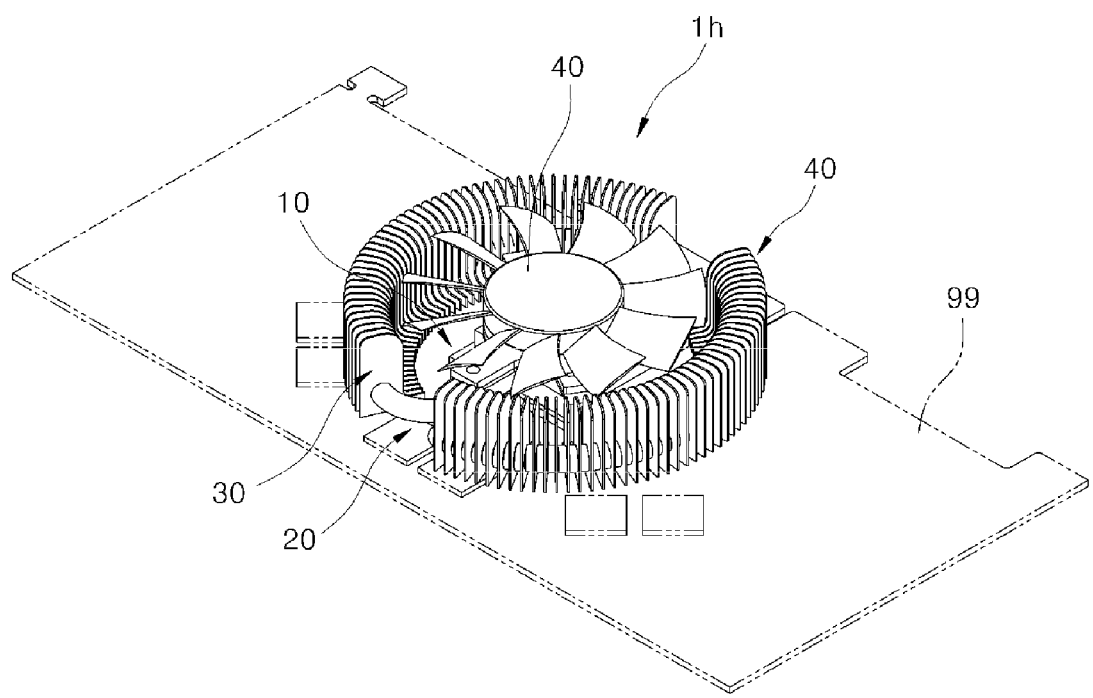
Figure 26A:
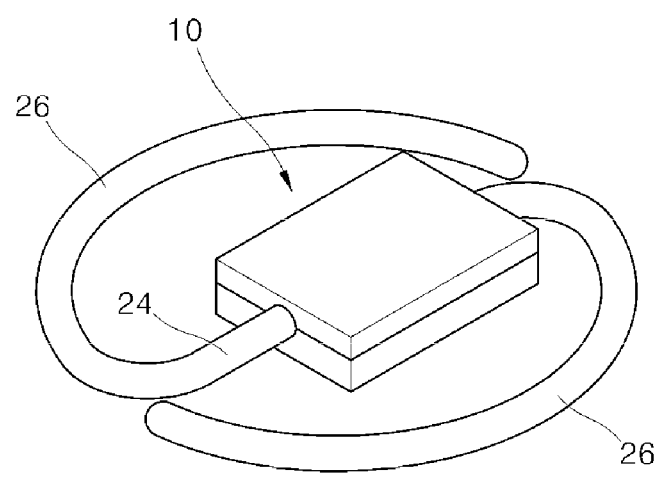
Figure 27:
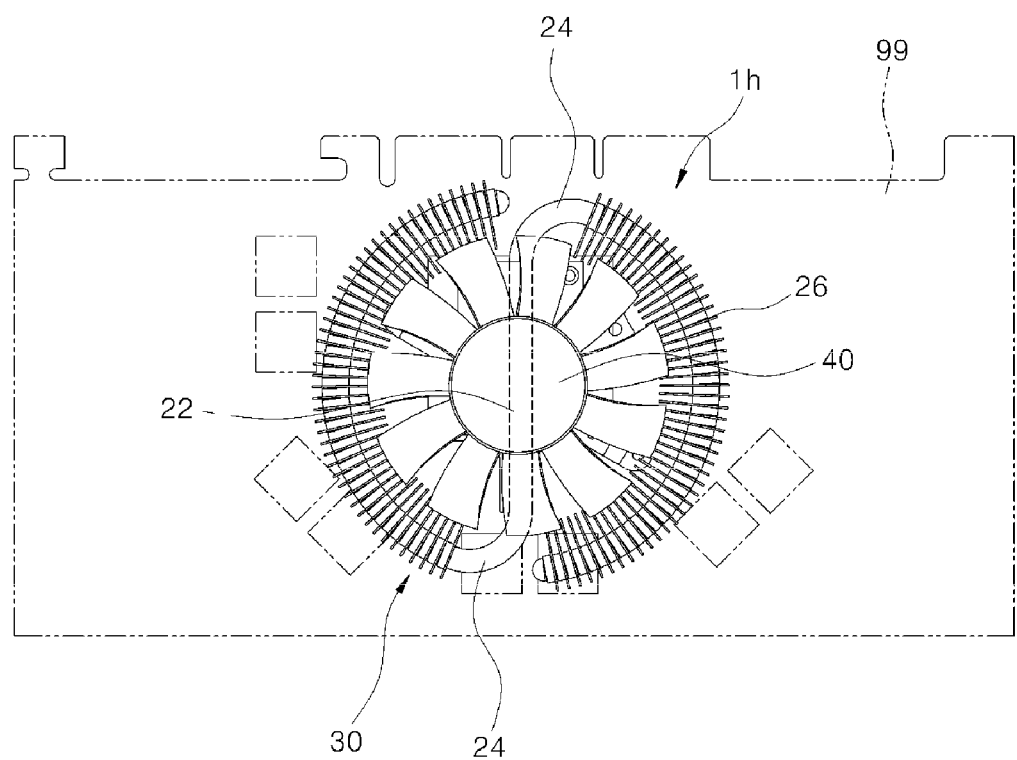
Figure 28:
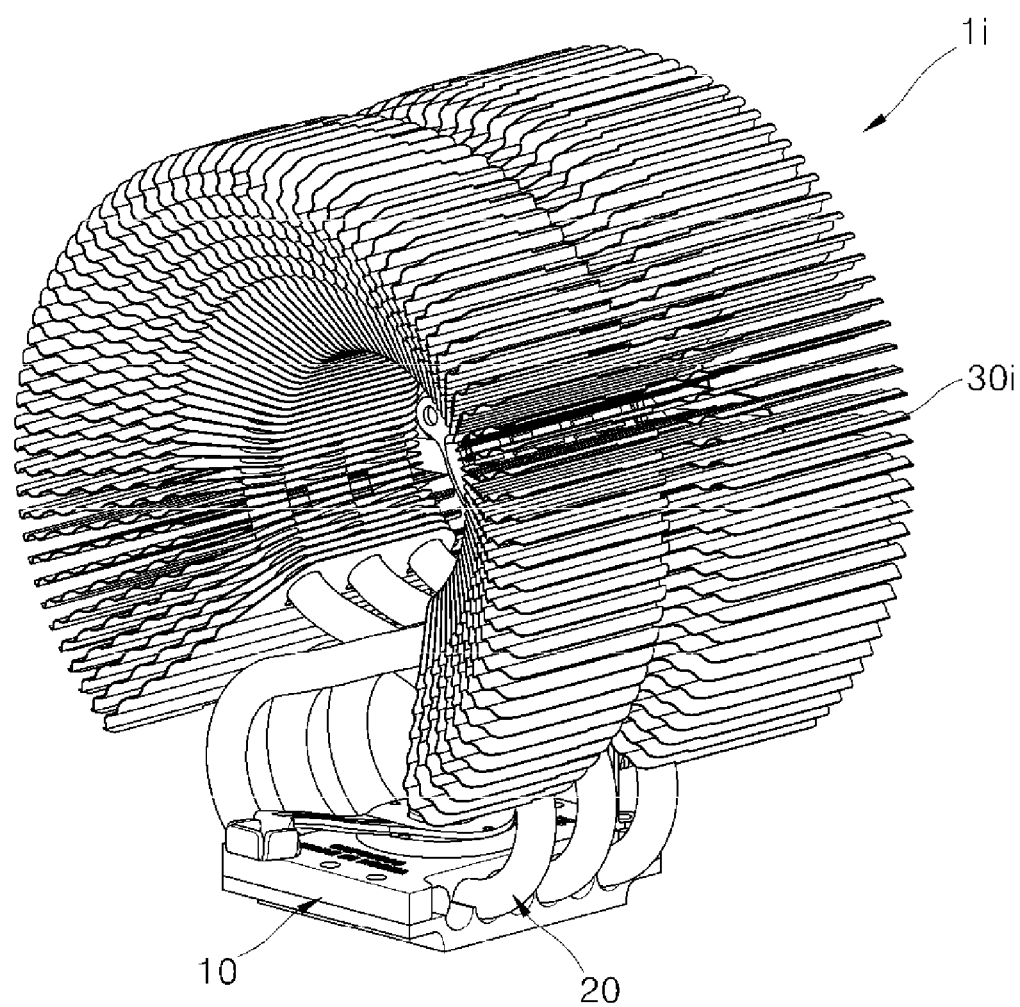
Figure 29:
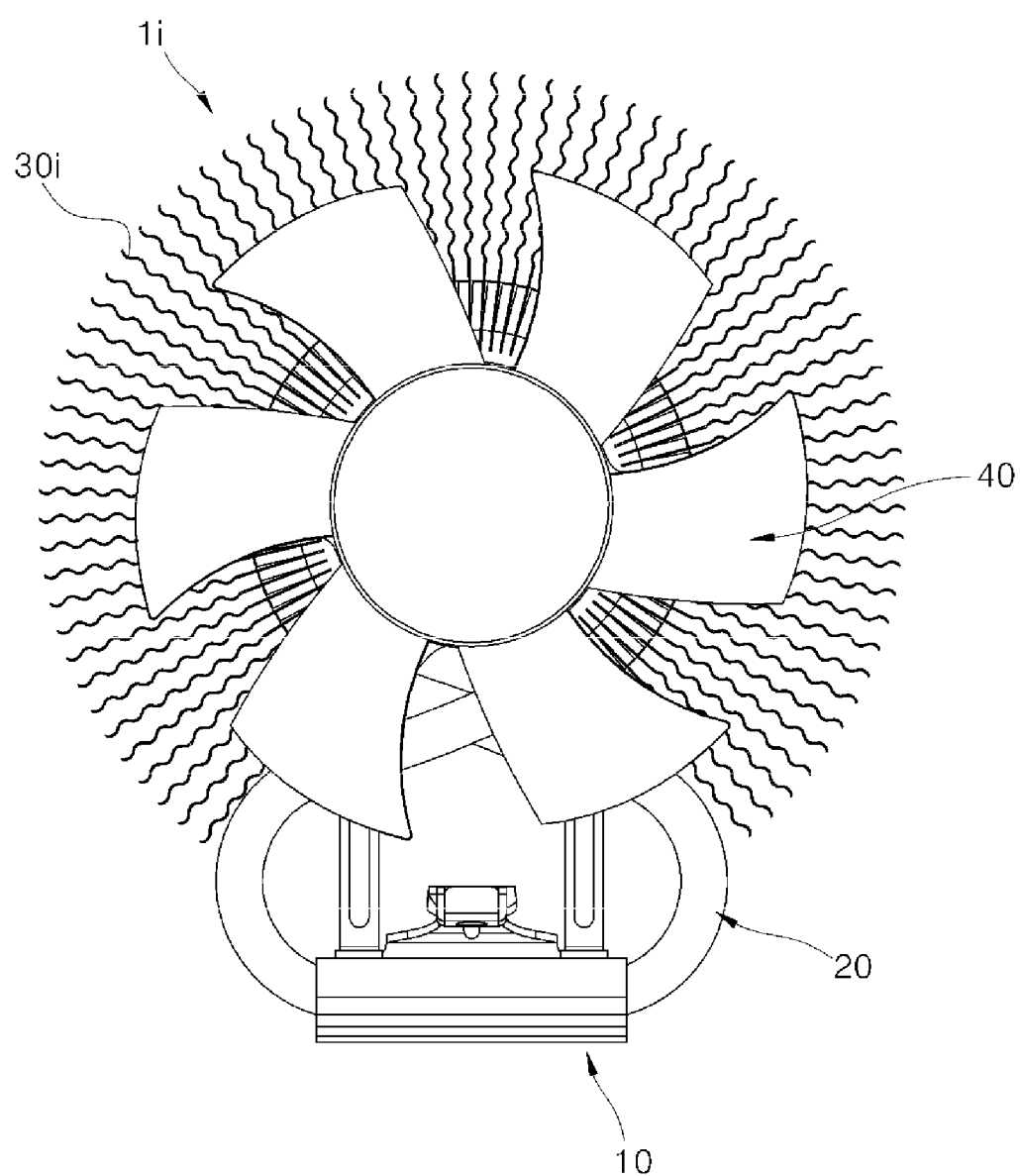
Figure 30:
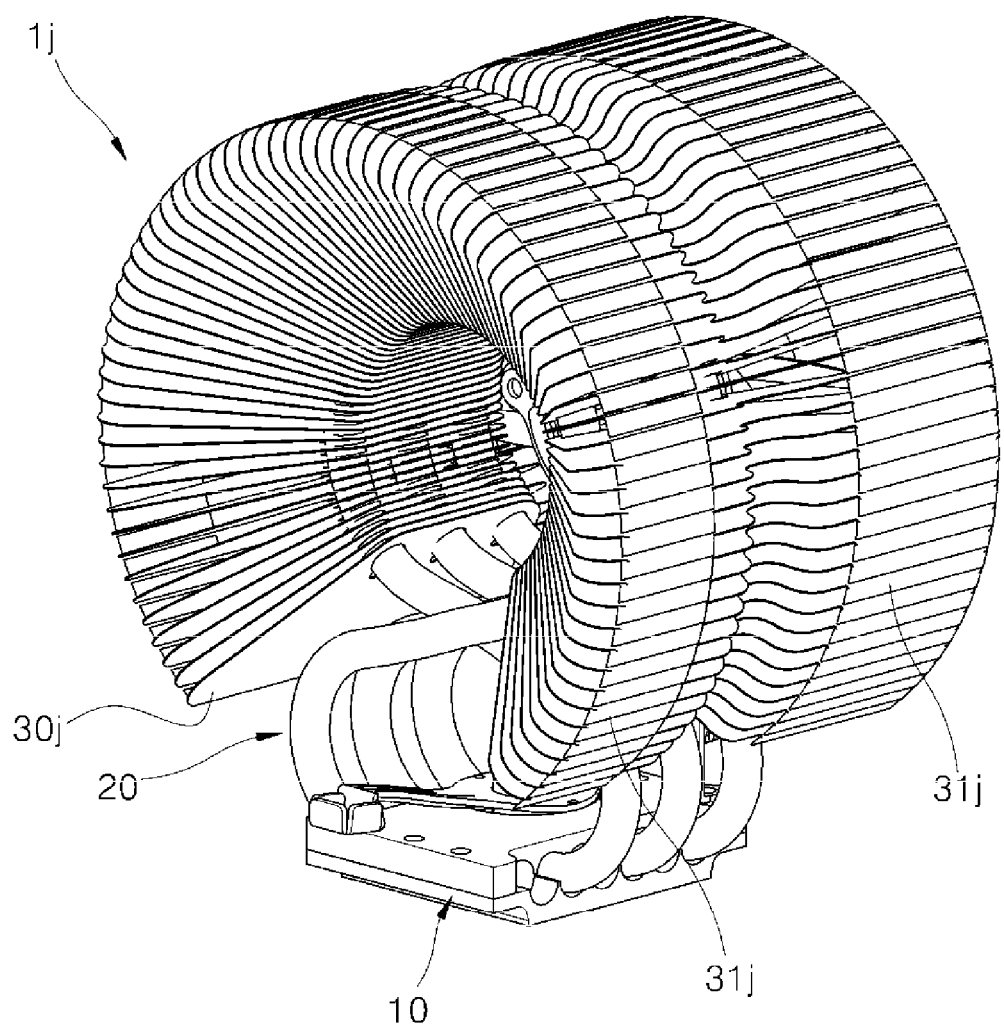
Figure 31:
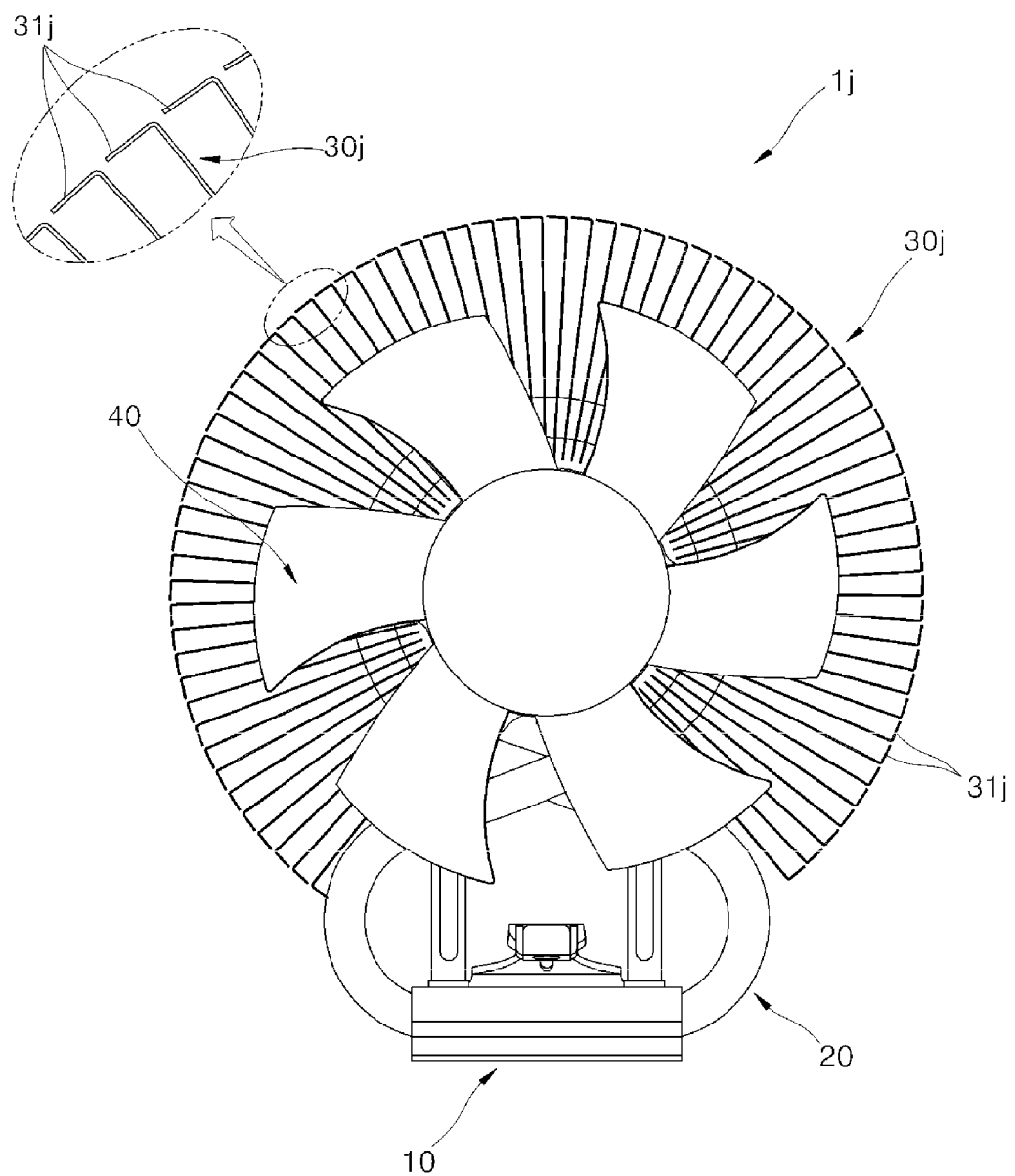
Figure 32:
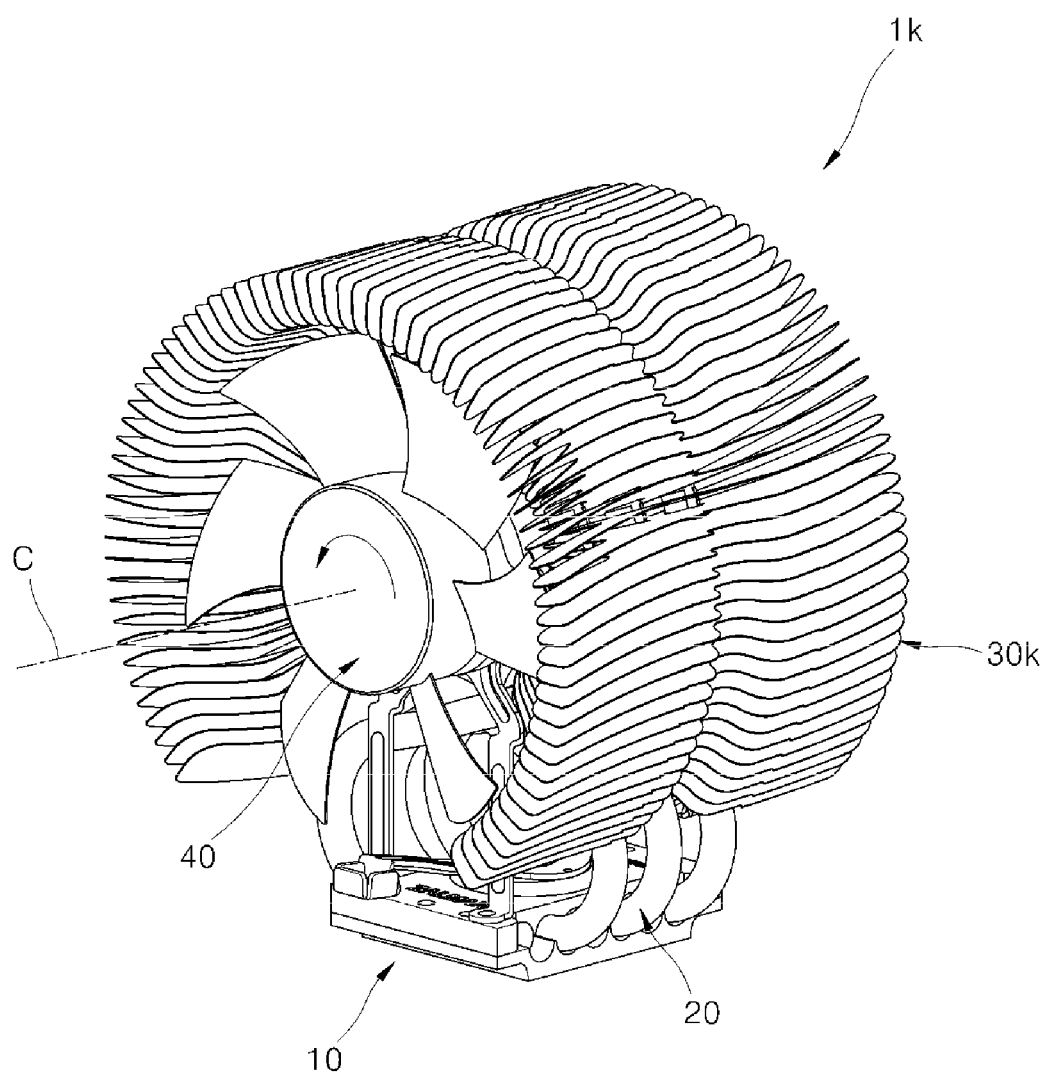
Figure 33:
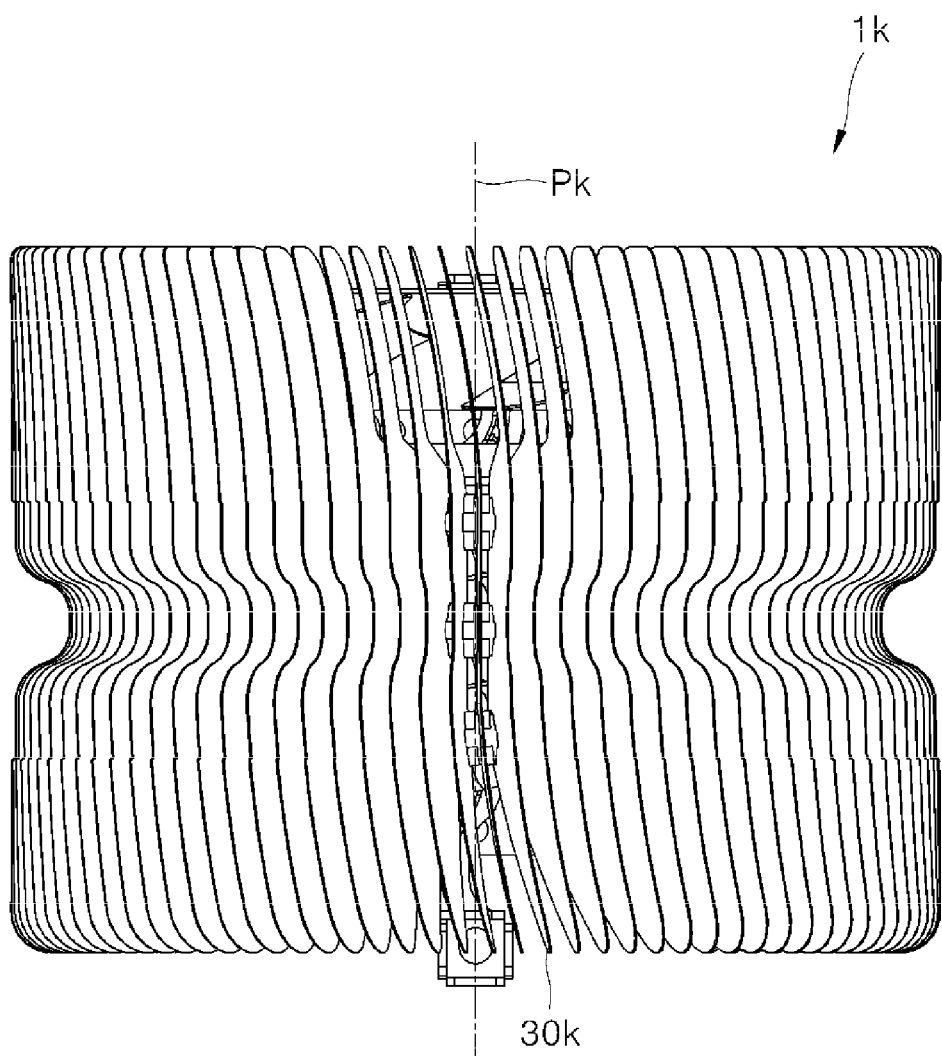
Figure 34:
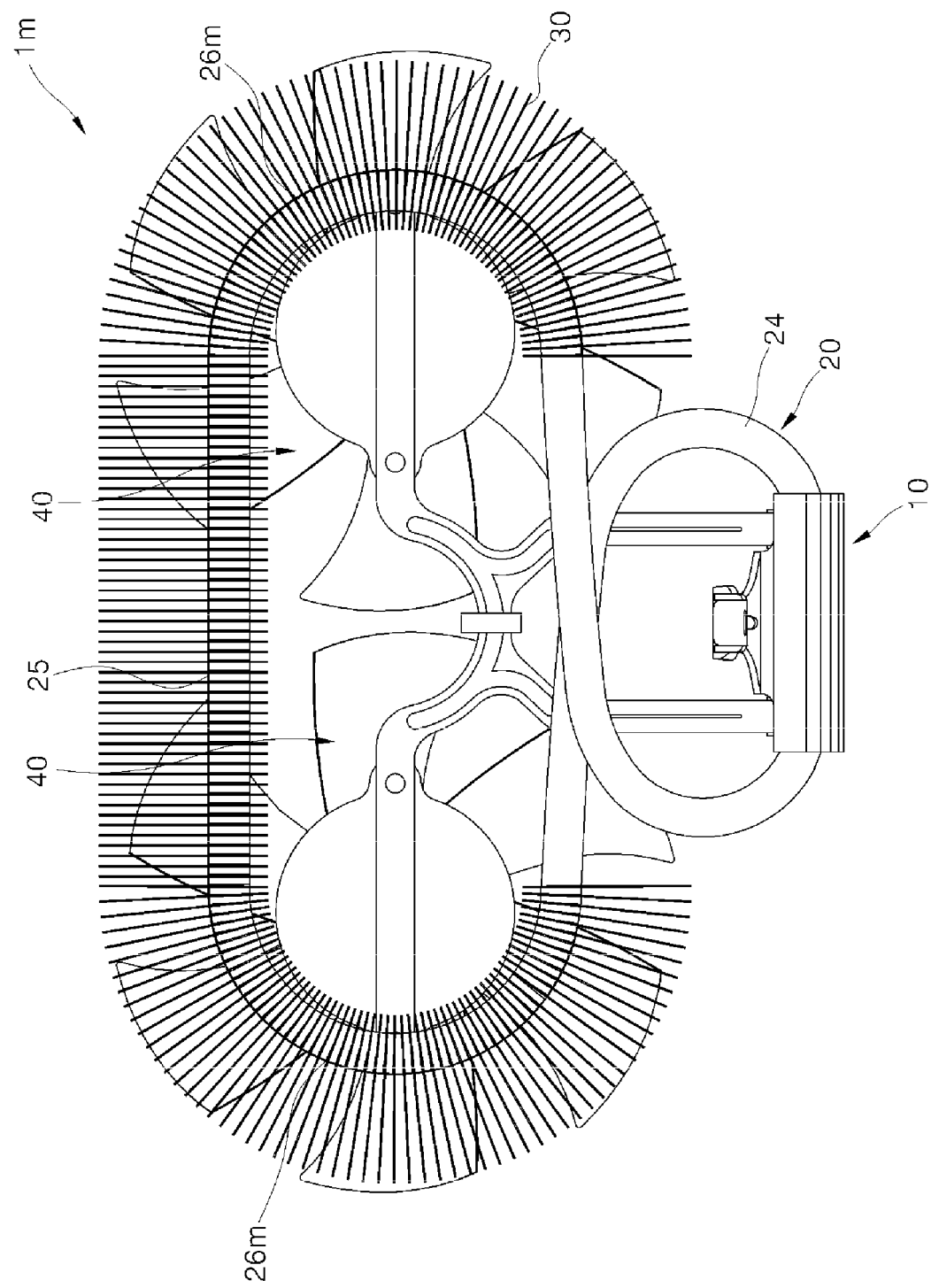
Figure 34A:
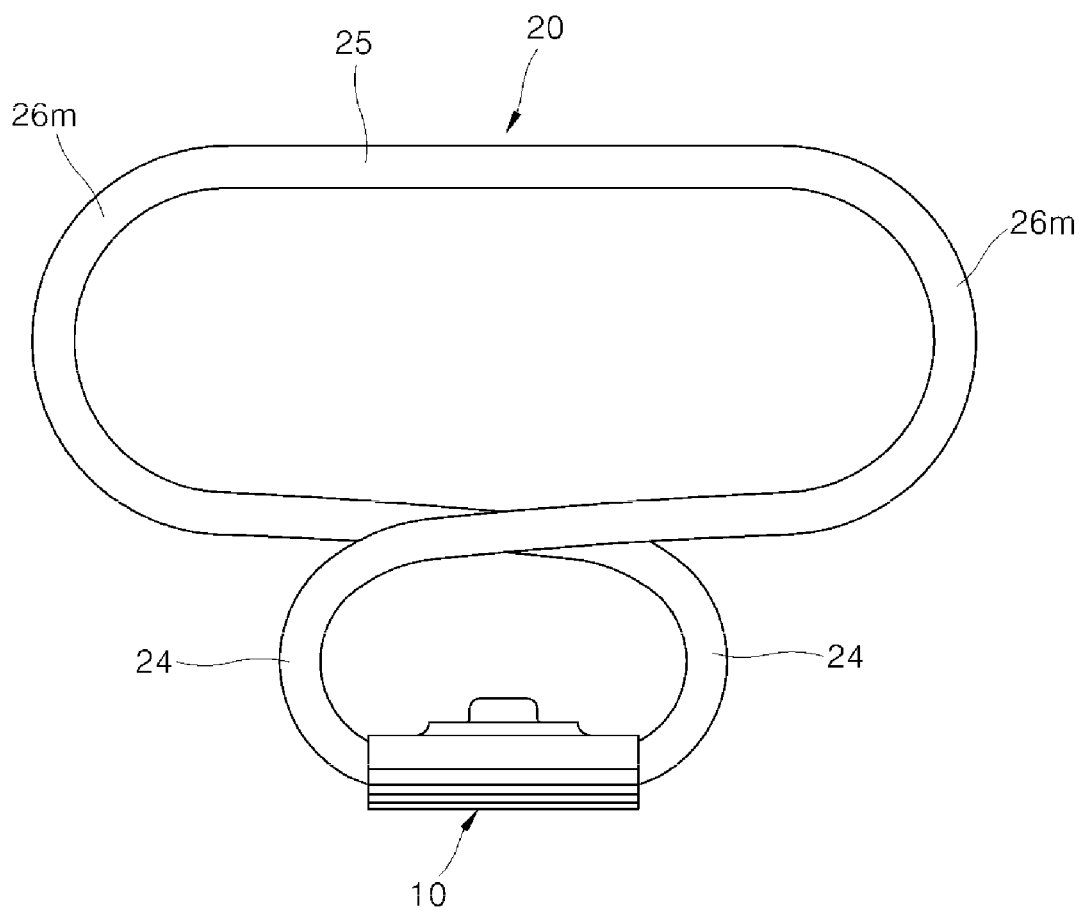
Figure 35:
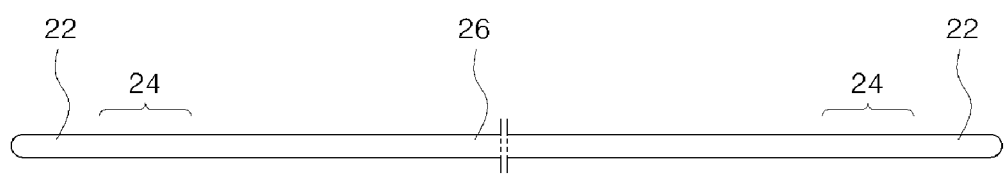
Figure 36:
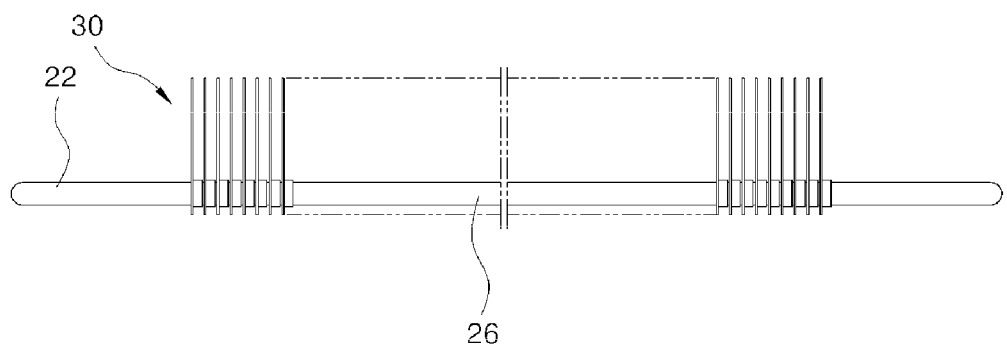
Figure 37:
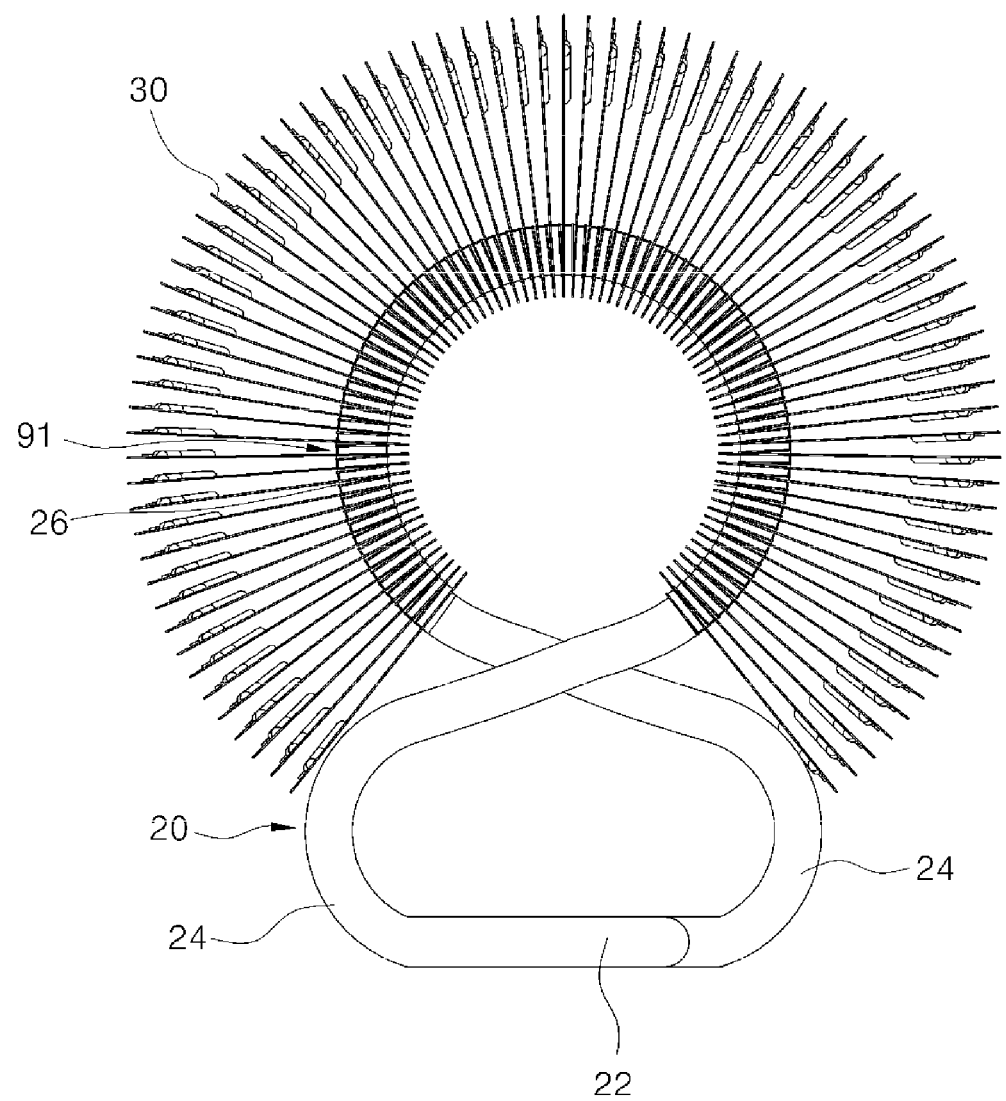

FIGS. 2, 3, and 4 are front, side, and rear views, respectively, of the apparatus for cooling computer parts shown in FIG. 2;

FIG. 5A is a view of the heat dissipating fins of FIG. 1;

FIG. 5B is a sectional view taken along line b-b' shown in FIG. 5A;

FIG. 6 is a perspective view of an apparatus for cooling computer parts according to another embodiment of the present invention;

FIG. 7 is a perspective view of the apparatus for cooling the computer parts shown in FIG. 6 from a duct member is removed;

FIG. 8 is a perspective view of the duct member of FIG. 6;

FIG. 9 is a perspective view of an apparatus for cooling computer parts according to another embodiment of the present invention;

FIG. 9A is a perspective view of a heat transferring block and heat pipes of FIG. 9;

FIGS. 10 and 11 are front and rear views, respectively, of the apparatus for cooling computer parts shown in FIG. 9;

FIG. 12 is a perspective view of an apparatus for cooling computer parts according to another embodiment of the present invention;

FIG. 12A is a perspective view of a heat transferring block and heat pipes of FIG. 12;

FIGS. 13 and 14 are front and side views, respectively, of the apparatus for cooling the computer parts shown in FIG. 12;

FIG. 15 is a perspective view of an apparatus for cooling computer parts according to another embodiment of the present invention;

FIG. 15A is a perspective view of a heat transferring block and heat pipes of FIG. 15;

FIGS. 16 and 17 are front and side views, respectively, of the apparatus for cooling the computer parts shown in FIG. 15;

FIG. 18 is a perspective view of an apparatus for cooling computer parts according to another embodiment of the present invention;

FIG. 18A is a perspective view of a heat transferring block and heat pipes of FIG. 18;

FIG. 19 is a plan view of the apparatus for cooling the computer parts shown in FIG. 18;

FIG. 20 is a perspective view of an apparatus for cooling computer parts according to another embodiment of the present invention;

FIG. 21 is a perspective view of the other side of the apparatus for cooling the computer parts shown in FIG. 20;

FIG. 21A is a perspective view of a heat transferring block and heat pipes of FIG. 18;

FIGS. 22 and 23 are bottom and side views, respectively, of the apparatus for cooling the computer parts shown in FIG. 20;

FIG. 24 is a perspective view of an apparatus for cooling computer parts according to another embodiment of the present invention;

FIG. 24A is a perspective view of a heat transferring block and heat pipes of FIG. 24;

FIG. 25 is a plan view of the apparatus for cooling the computer parts shown in FIG. 24;

FIG. 26 is a perspective view of an apparatus for cooling computer parts according to another embodiment of the present invention;

FIG. 26A is a perspective view of a heat transferring block and heat pipes of FIG. 26;

FIG. 27 is a plan view of the apparatus for cooling the computer parts shown in FIG. 26;

FIGS. 28 and 29 are a perspective view in a rear direction and a front view, respectively, of an apparatus for cooling computer parts according to another embodiment of the present invention;

FIGS. 30 and 31 are a perspective view in a rear direction and a front view, respectively, of an apparatus for cooling computer parts according to another embodiment of the present invention;

FIGS. 32 and 33 are perspective and plan views, respectively, of an apparatus for cooling computer parts according to another embodiment of the present invention;

FIG. 34 is a rear view of an apparatus for cooling computer parts according to another embodiment of the present invention;

FIG. 34A is a perspective view of a heat transferring block and heat pipes of FIG. 34; and FIGS. 35 through 37 are views for explaining a method of manufacturing an apparatus for cooling the computer parts according to an embodiment of the present invention.

DETAILED DESCRIPTION OF THE INVENTION

Embodiments of the present invention will be described with reference to the appended drawings.

FIGS. 1 through 5 illustrate an apparatus 1 for cooling computer parts according to an embodiment of the present invention. Referring to FIGS. 1 through 5, the apparatus 1 for cooling the computer parts dissipates the heat from heat generating parts in a computer that generate heat during operation of the computer. The heat generating part of the current embodiment of the present invention is a central processing unit (CPU) installed on a main board of the computer.

The apparatus 1 for cooling the computer parts dissipates heat generated by the CPU (not shown) of the computer and comprises a heat transferring block 10, heat pipes 20, a plurality of heat dissipating fins 30, and a cooling fan 40.

The heat transferring block 10 comprises a first member 12 and a second member 14. The first member 12 is made of copper or aluminum, which have high great thermal conductivity, is thermally coupled to the CPU that is the heat generating part in this embodiment. The first member 12 is adhered to the upper surface of the CPU and conducts heat away from the CPU. The second member 14 is adhered to the upper surface of the first member 12.

Grooves having a semi-circular cross section are formed at the facing surfaces of the first and second members 12 and 14. The grooves form heat pipe coupling holes 16 when the first and second members 12 and 14 are coupled together. Block coupling portions 22 of the heat pipes 20 are inserted into the heat pipe coupling holes 16, so that heat generated by the heat generating parts can be transferred to the heat pipes 20 through the first member 12.

The number of the heat pipe coupling holes 16 corresponds to the number of the heat pipes 20. The apparatus 1 for cooling the computer parts of the current embodiment of the present invention includes three heat pipes 20 and six heat pipe coupling holes 16 of the heat transferring block 10 so that both ends of each of the heat pipes 20 can be coupled.

The first and second members 12 and 14 are coupled to form the cylindrical heat pipe coupling holes 16 according to the current embodiment of the present invention but not limited thereto. That is, the cylindrical heat pipe coupling holes 16 may not be formed if portions corresponding to the heat pipes 20 can be interposed between the first and second members 12 and 14 in order to transfer the heat from the first member 12 to the heat pipes 20.

The apparatus 1 for cooling the computer parts further comprises a pair of elastic members 18 to adhere the heat transferring block 10 to the heat generating parts. The pair of elastic members 18 are made of elastic materials and form a single body as a whole. Referring to FIG. 3, the pair of elastic members 18 is formed at both sides of the upper portion of the heat transferring block 10. An edge of each of the pair of elastic members 18 is formed at the upper portion of the first member 12 and fixing portions 19 are formed at the ends of each of the pair of elastic members 18.

The bottom surface of the heat transferring block 10 is disposed on the upper surface of the heat generating parts, the ends of each of the pair of elastic members 18 formed at the heat transferring block 10 are elastically deformed by pressing them in a downward direction so the ends are disposed on the upper surface of a main board (not shown), and the fixing portions 19 are fixed to the main board, as illustrated in FIG. 3. In this regard, the fixing portions 19 are usually fixed to the main board by passing bolts through holes formed at the center of the fixing portions 19. The fixing portions 19 may be directly fixed to the main board. However, the fixing portions 19 can be fixed to an intermediate member, such as a cooler guide or cooler support member, which is installed on the main board.

The pair of elastic members 18 having the fixing portions 19 fixed to the main board strongly push the heat transferring block 10 to the upper surface of the heat generating parts by dynamic stability, so that the heat transferring block 10 is coupled to the heat generating parts and effectively conducts the heat away from the heat generating parts.

The heat pipes 20 conduct the heat transferred from the heat generating parts to the heat transferring block 10 and transfer the heat to a plurality of heat dissipating fins 30. Each of the heat pipes 20 comprises the block coupling portion 22, a connecting portion 24, and a fin coupling portion 26. The apparatus 1 for cooling the computer parts includes the three heat pipes 20. However, the number of the heat pipes 20 can vary as occasion demands.

According to the current embodiment of the present invention, the heat pipes 20, also called heat transferring pipes, absorb heat of a portion having a relatively high temperature and quickly transfer the heat to a portion having a relatively low temperature. However, the constitution of the heat pipes 20 that transfer heat is well known and thus, no further description of the heat pipes 20 is provided.

The block coupling portion 22 has a rectilinear shape and is inserted into the heat pipe coupling holes 16 formed at the heat transferring block 10. The exterior circumferential surface of the block coupling portion 22 is coupled to the inside of the heat pipe coupling holes 16 so that the heat pipes 20 can be thermally coupled to the heat transferring block 10 and receive the heat transferred from the heat generating parts to the heat transferring block 10. In the current embodiment of the present invention, the block coupling portion 22 is formed at both ends of each of the heat pipes 20.

The connecting portion 24 extending from the block coupling portion 22 connects the fin coupling portion 26 and the block coupling portion 22. More specifically, the connecting portion 24 is interposed between the block coupling portion 22 and the fin coupling portion 26 in each of the heat pipes 20. The connecting portion 24 is bent so that the fin coupling portion 26 can be disposed on a virtual plane of a desired upper portion of the heat transferring block 10.

According to the current embodiment of the present invention, the connecting portion 24 is formed at both ends of each of the heat pipes 20. However, although not shown, if the block coupling portion 22 is formed at one of each of the heat pipes 20, the connecting portion 24 can be formed at a portion between the block coupling portion 22 and the fin coupling portion 26. More specifically, the block coupling portion 22 is formed at one end of each of the heat pipes 20, a portion extending from the block coupling portion 22 forms the connecting portion 24, and other portion extending therefrom forms the fin coupling portion 26.

For descriptive convenience, referring to FIG. 3 illustrating the heat pipe 20 in virtual bold lines disposed at the upper left corner of FIG. 2, the connecting portions 24 extending from both ends of each of the heat pipes 20 that are coupled to the heat pipe coupling holes 16 of the heat transferring block 10 are twisted 3-dimensionally so that the fin coupling portion 26 can be formed at a perpendicular virtual surface P.

Referring to FIG. 4, a portion extending from the RHS of the block coupling portion 22 forms a part of the connecting portion 24 and is connected to the fin coupling portion 26 in the left of the fin coupling portion 26. A portion extending from the LHS of the block coupling portion 22 forms another part of the connecting portion 24 and is connected to the fin coupling portion 26 in the right of the fin coupling portion 26. The ends of both connecting portions 24 of the current embodiment of the present invention cross each other in order to lower the height of the fin coupling portion 26 and maximize the length of the heat pipes 20 inserted into the heat dissipating fins 30. The connecting portion is generally shaped as "J" in FIG. 4. The shape of the connecting portion 24 may be varied if required.

The fin coupling portion 26 is a curve portion of each of the heat pipes 20, extending from the block coupling portion 22, and is inserted into the heat dissipating fins 30. The shape of the fin coupling portions 26 may be varied if required. One or more fin coupling portion can be formed at each of the heat pipes.

According to the current embodiment of the present invention, the apparatus 1 for cooling the computer parts includes one fin coupling portion 26 that forms substantially circular arc. The "substantially circular arc" does not mean a mathematically perfect part of a perfect circle but means a bent shape generally recognized by users as or corresponding to a circular arc. The fin coupling portion 26 may have a schematic or substantial ring, chain, or circular shape.

The fin coupling portion 26 of the current embodiment of the present invention forms a circular arc but is not limited thereto. That is, the fin coupling portion 26 may have substantially an oval shape or a partial oval shape. These may be two fin coupling portions 26 instead of one if required. The oval shape will be described later.

Referring to FIG. 4, the fin coupling portion 26 has a circular arc shape corresponding to a major arc which is longer than the other arc in which both arcs connect two virtual points P2 and P3 in a virtual circle C having a virtual center point P1.

Referring to FIG. 2, the fin coupling portion 26 is coupled to the interior circumferential surfaces of perforation holes 32 and spacers 36 of the heat dissipating fins 30. A small portion of the fin coupling portion 26 is between the heat dissipating fins 30 is exposed to the outside.

Figure 1A:
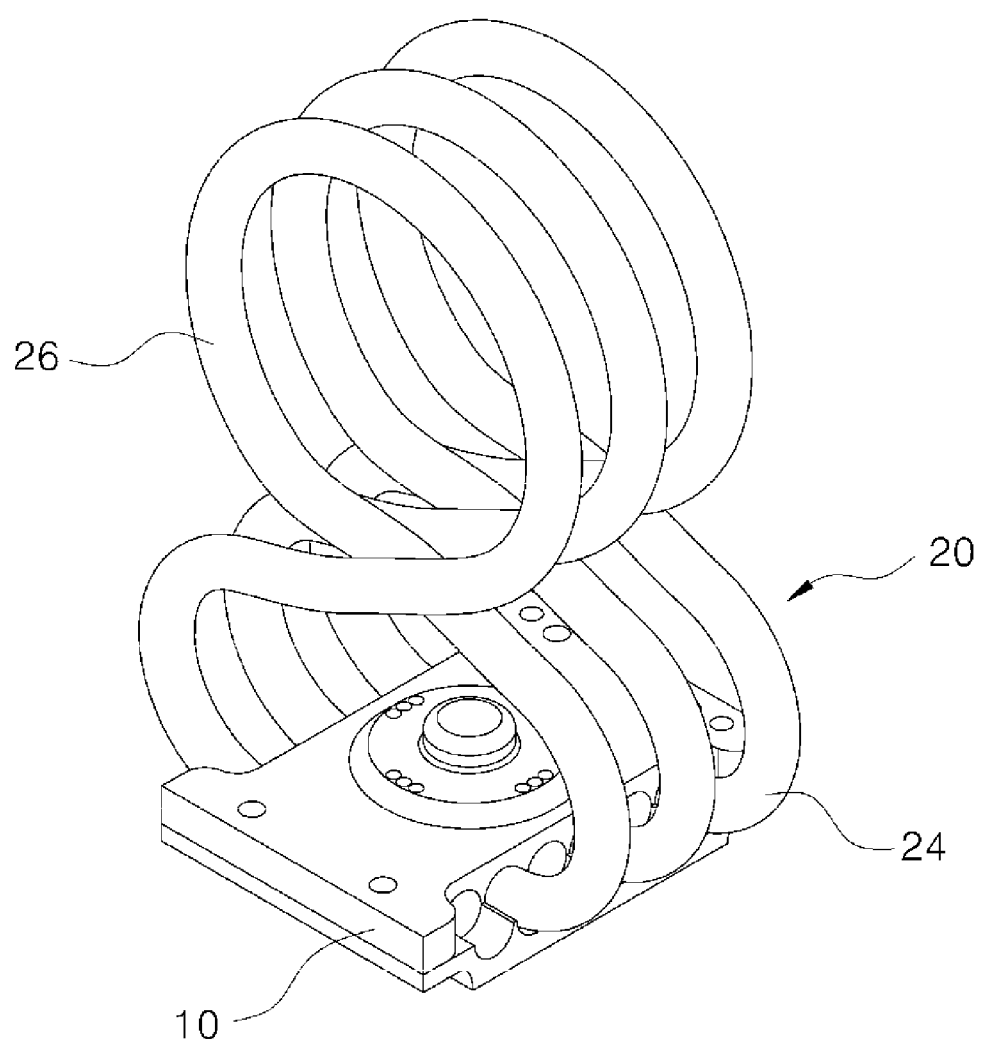
FIG. 1A is a perspective view of a heat transferring block and heat pipes of FIG. 1.

The heat transferring block 10 and the heat pipes 20 are shown in FIG. 1A in which the heat dissipating fins 30 and the cooling fan 40 are removed from the apparatus 1 for cooling the computer parts so that the fin coupling portion 26 can be more clearly presented.

According to the current embodiment of the present invention, the fin coupling portion 26 is formed at a portion, extending from the block coupling portion 22 of both ends of each of the heat pipes 20 together with connecting portion 24. The fin coupling portion 26 is perpendicular to the upper surface of the heat transferring block 10. The virtual surface P is parallel to the plane of the fin coupling portion 26. That is, referring to FIG. 3, the virtual surface P parallel to the fin coupling portion 26 is perpendicular to the upper surface of the heat transferring block 10.

The heat dissipating fins 30 are coupled to the fin coupling portion 26 of each of the heat pipes 20. The heat dissipating fins 30 are made of a thin copper or aluminum film having a high thermal conductivity. The heat dissipating fins 30 are spaced apart from one another on the fin coupling portion 26. In the current embodiment of the present invention, the heat dissipating fins 30 are arranged to radially extend from the fin coupling portion 26 having the circular arc shape and thus, have a columnar or cylindrical shape as a whole, as shown in FIGS. 1 and 4.

Referring to FIG. 5A, the heat dissipating fins 30 comprise the perforation holes 32. The number of perforation holes 32 in each fin is the same as the number of heat pipes 20. The fin coupling portions 26 of the heat pipes 20 are inserted into the respective perforation holes 32.

Each of the heat dissipation fins 30 includes a spacer 36 to maintain a constant space between the heat dissipation fins 30. Each of the spacers 36 extends out from the heat dissipating pin 30 and shares the same circumferential surfaces as the perforation hole 32. Referring to FIG. 5B, the spacers 36 are projected from the heat dissipating fins 30 in the right direction. A space between the heat dissipating fins 30 depends on how far the spacers 36 are projected from the surfaces of the heat dissipating fins 30.

In the current embodiment of the present invention, since the heat dissipating fins 30 are made of a highly ductile material, the spacers 36 are formed when the heat dissipating fins 30 are punched to form the perforation holes 32 and are simultaneously projected from exterior circumferential surfaces of the perforation holes 32. The spacers 36 may form a complete cylinder. However, the spacers 36 may be projected partly torn by the punching operation.

The spacers 36 can be formed by cutting a part of the heat dissipating fins 30, for example, cutting three surfaces of a rectangle and leaving the other surface, or attaching a separate member to the heat dissipating fins 30.

In the current embodiment of the present invention, a concave portion 34 is formed at each of the heat dissipating fins 30 by removing a part of each of the heat dissipating fins 30. The concave portion 34 is used to enclose or partially enclose the cooling fan 40. More specifically, the heat dissipating fins 30 having the concave portion 34 are arranged on the fin coupling portion 26 so that a concave portion 34 is formed at the entrance of each of the heat dissipating fins 30 arranged to extend radially from the fin coupling portion 26 as illustrated in FIG. 1. Air flow produced by the cooling fan 40 can be effectively transferred to the spacing between the heat dissipating fins 30 by the existence of the concave portion 35.

The heat dissipating fins 30 and the fin coupling portions 26 of each of the heat pipes 20 may be soldered to each other. In the current embodiment of the present invention, a soldering portion is formed by coating cream solder and the coated cream solder is interposed between a circumference portion of each of the perforation holes 32 of the heat dissipating fins 30 and the fin coupling portion 26 inserted into the perforation holes 32 so that the heat dissipating fins 30 and the fin coupling portion 26 are tightly coupled.

In the current embodiment of the present invention, the heat dissipating fins 30 are coupled to the fin coupling portion 26 having the circular arc shape such that the heat dissipating fins 30 are arranged to extend radially from the fin coupling portion 26. Referring to FIG. 4, the heat dissipating fins 30 are disposed on the fin coupling portion 26 so that an empty space is formed at the center of the heat dissipating fins 30 arranged to extend radially from the fin coupling portion 26. The size of the empty space can be determined according to the radius of curvature of the fin coupling portion 26 and the length of a part extending from the perforation hole 32 of each of the heat dissipating fins 30 to the upper surface thereof. An amount of materials necessary for the heat dissipating fins 30 can be considerably reduced, and the flow characteristics of air surrounding the heat dissipating fins 30 can be improved owing to the empty space, thereby increasing the cooling performance.

In the current embodiment of the present invention, the heat dissipating fins 30 are coupled to the fin coupling portions 26 so that spaces between the ends of the heat dissipating fins 30 on the inside of the fin coupling portion 26 are smaller than spaces between the ends of the heat dissipating fins 30 on the outside of the fin coupling portion 26. Referring to FIGS. 2 and 4, the heat dissipating fins 30 are arranged to extend radially from the fin coupling portion 26 so that spaces between the heat dissipating fins 30 are smaller in the center direction of the fin coupling portion 26 and larger in the outside direction of the fin coupling portion 26.

The cooling fan 40 includes a center driving portion 42 and a plurality of blade portions 44, and is formed at one side of the heat dissipating fins 30. In the current embodiment of the present invention, the cooling fan 40 is disposed on the concave portion 35 formed at on side of the heat dissipating fins 30.

The center driving portion 42 in which a motor is embedded includes a driving portion fixed to the heat transferring block 10 and a rotating center portion which rotates with a rotating axis of the motor. The driving portion of the center driving portion 42 is fixed to the heat transferring block 10 by a pair of leg portions 46. The rotating axis of the center driving portion 42 is disposed on the center of the fin coupling portion 26 of each of the heat pipes 20.

The blade portions 44 are coupled to the exterior circumferential surface of the center portion of the center driving portion 42, and produce air flow when they rotate. The blade portions 44 supply air to spaces between the heat dissipating fins 30 coupled to the fin coupling portion 26.

The heat dissipating fins 30 of the current embodiment of the present invention are arranged on the fin coupling portion 26 so that the empty space is formed at the rear of the center driving portion 42 of the cooling fan 40. The "rear of the center driving portion 42" means a side of the cooling fan 40 facing a direction in which air flow produced by the blade portions 44 of the cooling fan 40 is supplied. The empty space may be equal to the space through which at least a virtual circle forming the circumferential surface of the center driving portion 42 of the cooling fan 40 can pass.

When the heat dissipating fins 30 are arranged to extend radially from the fin coupling portion 26, the empty space formed at the center of the heat dissipating fins 30 may be equal to a column or cylinder of which bottom surface is the virtual circle forming the circumferential surface of the center driving portion 42. The cooling fan 40 produces air flow in the rear direction thereof, there is almost no air flow near the center of the cooling fan and most of the airflow occurs near the outer part of the cooling fan. Therefore, the empty space formed by removing parts of the heat dissipating fins 30 located in the rear of the center driving portion 42 makes it possible to considerably reduce an amount of materials necessary for the heat dissipating fins 30, thereby reducing the weight of the apparatus 1 for cooling the computer parts and manufacturing cost thereof.

The operation and effect of the apparatus 1 for cooling the computer parts according to the current embodiment of the present invention will now be described.

The apparatus 1 for cooling the computer parts comprises the heat pipes 20 such that the heat transferring block 10 can quickly transfer heat to the heat dissipating fins 30. In particular, unlike conventional apparatuses, the apparatus 1 for cooling the computer parts can reduce necessary materials since the heat dissipating fins 30 are spaced apart from each other and are coupled to the fin coupling portion 26 having a circular arc and bent ring or chain shape of each of the heat pipes 26. Since heat dissipating fins are conventionally inserted into rectilinear heat pipes, the diversity of the shape of heat pipes and heat dissipating fins should be limited and thus cannot have a proper shape for dissipating heat.

According to the current embodiment of the present invention, the cooling fan 40 is formed at the heat dissipating fins 30 such that the heat dissipating fins 30 are arranged to extend radially to be disposed on the rear direction of the blade portions 44 of the cooling fan 40 and an empty space is formed at the rear direction of the center driving portion 42, thereby effectively cooling the computer parts using air produced by the cooling fan 40.

The air flow produced by the blade portions 44 does not influence portions other than a portion in the rear direction of the blade portions 44 so that materials necessary for the heat dissipating fins 30 can be reduced, thereby considerably increasing an amount of heat dissipated per the heat dissipating fins 30 weight.

The air flow produced by the blade portions 44 is generally strong in exterior ends of the blade portions 44 rather than interior portions of the blade portions 44 contacting the center driving portion 42. However, the heat dissipating fins 30 of the current embodiment of the present invention are arranged to extend radially and spaces between their exterior ends are bigger than spaces between their interior ends so that relatively weak air flow produced inside the blade portions 44 are supplied to narrowly formed at side the blade portions 30, and strong air flow produced outside the blade portions 44 can be supplied to widely formed exterior heat dissipating fins 30 and dissipated fluently.

The airflow produced by the cooling fan 40 smoothly flows as a whole. Therefore, the win produced by the cooling fan 40 can be effectively used to dissipate heat transferred to the heat dissipating fins 30. Although the heat dissipating fins 30 in the present invention have relatively less weight compared to conventional ones, they are arranged to optimize the cooling capacity per weight.

The apparatus 1 for cooling the computer parts includes the cooling fan but not limited thereto. The apparatus 1 for cooling the computer parts can acquire sufficient effect without the cooling fan 40, except the effect obtained from the cooling fan 40. More specifically, the heat dissipating fins 30 can effectively be arranged to extend radially from the heat pipes 20 having the fin coupling portion 26, thereby more improved cooling performance than conventional apparatuses can be expected.

FIGS. 6 through 23 illustrate an apparatus 1a for cooling the computer parts according to another embodiment of the present invention. Hereinafter, the differences between the previous embodiment of the present invention and the current embodiment of the present invention will now be described. That is, descriptions omitted in the current embodiment of the present invention refer to the descriptions included in the previous embodiment of the present invention. Also, like reference numerals in the drawings denote like elements.

Referring to FIGS. 6 through 8, the apparatus 1a for cooling the computer parts further comprise a duct member 50 in addition to the constituents of the apparatus 1 for cooling the computer parts.

The duct member 50 surrounds the heat dissipating fins 30 to transfer airflow produced by the cooling fan 40 to the heat dissipating fins 30 losslessly and effectively. The duct member 50 prevents the heat dissipating fins 30 made of thin metal plates from being transformed due to contact of an external object so that the spaces between the heat dissipating fins 30 can remain constant. Also, the duct member 50 prevents a user from suffering a burn due to hot heat dissipating fins 30.

The duct member 50 is spaced apart from the heat dissipating fins 30 and the space between the duct member 50 and heat dissipating fins 30 are the shorter, the better. The duct member 50 is opened in both directions to which the airflow produced by the cooling fan 40 comes in and out. The duct member 50 is cylindrical- or pipe-shaped, and is fixed to the heat transferring block 10 using a pair of leg portions 52 formed at the bottom surface of the duct member 50. The length of the heat transferring block 10 of the current embodiment of the present invention is greater than that of the previous embodiment of the present invention so as to fix the leg portions 52 of the duct member 50.

The constitution of the heat transferring block 10, the heat pipes 20, the heat dissipating fins 30, and the cooling fan 40 of the current embodiment of the present invention is substantially the same as that of the previous embodiment of the present invention. However, the concave portion 34 for the cooling fan 40 may not be formed at the heat dissipating fins 30 so that the cooling fan 40 formed at the heat dissipating fins 30 is relatively large.

FIGS. 9 through 11 illustrate an apparatus 1b for cooling the computer parts according to another embodiment of the present invention.

Referring to FIGS. 9 through 11, the heat pipes 20 included in the apparatus 1b for cooling the computer parts have a different shape from that of the apparatus 1 for cooling the computer parts. That is, although both apparatuses 1 and 1b are identical to each other in that each of the heat pipes 20 consists of the block coupling portion 22, the connecting portion 24, and the fin coupling portion 26, apparatuses 1 and 1b are different from each other in the bent shape of the connecting portion 24. More specifically, the connecting portion 24 of each of the heat pipes 20 does not cross itself. The connecting portion is substantially vertically positioned along a straight line which is slightly bent in the shape of "s" in FIG. 11. The fin coupling portion 26 is shorter than that of the apparatus 1 for cooling the computer parts and also forms a circular arc of a major arc.

To more clearly present the shape of the fin coupling portion 26 of the current embodiment of the present invention, only the heat transferring block 10 and the heat pipes 20 coupled to the heat transferring block 10 are illustrated in FIG. 9A. The constitution of the heat transferring block 10, the heat dissipating fins 30, and the cooling fan 40 is similar or identical to that of the apparatus 1 for cooling the computer parts.

FIGS. 12 through 14 illustrate an apparatus 1c for cooling the computer parts according to another embodiment of the present invention. Referring to FIGS. 12 through 14, the heat pipes 20 included in the apparatus 1c for cooling the computer parts have a different shape from those of the apparatuses 1 and 1a for cooling the computer parts. That is, although three apparatuses 1, 1a, and 1c are identical to one other in that each of the heat pipes 20 includes the block coupling portion 22, the connecting portion 24, and the fin coupling portion 26, the connecting portion 24 of the apparatus 1c for cooling the computer parts is relatively shorter than those of the apparatuses 1 and 1a for cooling the computer parts. More specifically, the connecting portion 24 of each of the heat pipes 20 does not cross itself or have a negative radius of curvature. The fin coupling portion 26 is shorter than that of the apparatus 1 for cooling the computer parts and also forms a major arc or a part of a ring.

To more clearly present the shape of the fin coupling portion 26 of the current embodiment of the present invention, only the heat transferring block 10 and the heat pipes 20 coupled to the heat transferring block 10 are illustrated in FIG. 12A.

According to the current embodiment of the present invention, although the configuration to which the heat pipes 20 and the heat transferring block 10 are coupled is different from those of previous embodiments of the present invention, functions of the heat pipes 20 and the heat transferring block 10 are not different from those of previous embodiments of the present invention. The constitution of the heat transferring block 10, the heat dissipating fins 30, and the cooling fan 40 is substantially identical to that of the apparatus 1 for cooling the computer parts.

FIGS. 15 through 17 illustrate an apparatus 1d for cooling the computer parts according to another embodiment of the present invention. Referring to FIGS. 15 through 17, the heat pipes 20 included in the apparatus 1d for cooling the computer parts have a different shape from that of the apparatus 1 for cooling the computer parts. That is, although both apparatuses 1 and 1d are identical to each other in that each of the heat pipes 20 includes the block coupling portion 22, the connecting portion 24, and the fin coupling portion 26, both fin coupling portion 26 of each of the heat pipes 20 of the current embodiment of the present invention extends from same side of the heat transferring block 10.

To more clearly present the shape of the fin coupling portion 26 of the current embodiment of the present invention, only the heat transferring block 10 and the heat pipes 20 coupled to the heat transferring block 10 are illustrated in FIG. 15A.

Referring to FIG. 17, the connecting portion 24 of each of the heat pipes 20 forms an L-shape, and is disposed on the rear upper portion of the heat transferring block 10. And, the fin coupling portion 26 also forms a major arc or a part of a ring. C FIGS. 18, 18A, and 19 illustrate an apparatus 1e for cooling the computer parts according to another embodiment of the present invention. Referring to FIGS. 18, 18A, and 19, the apparatus 1e for cooling the computer parts is different from the apparatus 1 for cooling the computer parts in that a virtual surface on which the heat dissipating fin coupling portion 26 of each of the heat pipes 20 is formed is substantially parallel to the upper surface of the heat transferring block 10. More specifically, although both apparatuses 1 and 1e are identical to each other in that each of the heat pipes 20 includes the block coupling portion 22, the connecting portion 24, and the fin coupling portion 26, the fin coupling portion 26 of each of the heat pipes 20 of the current embodiment of the present invention is parallel to the heat transferring block 10.

However, the constitution and operation of the heat transferring block 10, the heat dissipating fins 30, and the cooling fan 40 is substantially identical to that of the apparatus 1 for cooling the computer parts. The apparatus 1e for cooling the computer parts is relatively short, so that a space occupied by the apparatus 1e can be reduced.

To more clearly present the shape of the fin coupling portion 26 of the current embodiment of the present invention, only the heat transferring block 10 and the heat pipes 20 coupled to the heat transferring block 10 are illustrated in FIG. 18A.

According to the above embodiments of the present invention, the heat generating parts is a CPU but not limited thereto. That is, the apparatus for cooling the computer parts may use a chipset mounted in a substrate of a graphic adapter embedded in a main board of a computer as the heat generating parts if required.

FIGS. 20 through 23 illustrate an apparatus 1f for cooling the computer parts according to another embodiment of the present invention. Referring to FIGS. 20 through 23, the apparatus 1f for cooling the computer parts is different from the apparatus 1e for cooling the computer parts in that the heat generating parts is not a CPU but a chipset mounted in a substrate 99 of a graphic adapter embedded in a main board of a computer. That is, the apparatus 1f for cooling the computer parts is used to cool the chipset of the graphic adapter. The graphic adapter called a video graphic adapter (VGA) card is inserted into the main board and its space is limited so that the apparatus 1f for cooling the computer parts can be suitably modified.

The heat transferring block 10 is tightly coupled to the chipset. The fin coupling portion 26 of each of the heat pipes 20 faces the heat transferring block 10 with the substrate 99 therebetween. The fin coupling portion 26 also forms a circular arc similar to a circle. The connecting portion 24 is connected to the block coupling portion 2 on one side of the substrate 99 and bent around to the other side of the substrate 99, where the heat dissipating fins coupling portion 26 is bent so as to be approximately coplanar with and toe be spread out over at lease part of the surface of the other side of the substrate 99. More specifically, the heat pipes 20 are formed so that the apparatus 1f for cooling the computer parts does not use a front space including the chipset but the fin coupling portion 26 and the heat dissipating fins 30 coupled to the fin coupling portion 26 use a rear space of the substrate 99. The constitution of other constituents properly corresponds to that of the previous embodiment of the present invention.

To more clearly present the shape of the fin coupling portion 26 of the current embodiment of the present invention, only the heat transferring block 10 and the heat pipes 20 coupled to the heat transferring block 10 are illustrated in FIG. 21A.

FIGS. 24 and 25 illustrate an apparatus 1g for cooling the computer parts according to another embodiment of the present invention. Referring to FIGS. 24 and 25, the apparatus 1g for cooling the computer parts is identical to the apparatus 1f for cooling the computer parts in terms of a chipset mounted in the substrate 99 of a graphic adapter embedded in a main board of a computer. That is, the apparatus 1g for cooling the computer parts also is used to cool the chipset of the graphic adapter. However, the apparatus 1g for cooling the computer parts is different from the apparatus 1f for cooling the computer parts in that the heat transferring block 10 and the fin coupling portion 26 of each of the heat pipes 20 do not face each other but are parallel to the substrate 99. More specifically, the fin coupling portion 26 extending from the block coupling portion 22 forms the connecting portion 24 at the same height as the block coupling portion 22, and surrounds the heat transferring block 10 at the same height as the block coupling portion 22, thus are relatively smaller than those of the previous embodiments of the present invention. The center space of the heat dissipating fins 30 is relatively larger than those of other previous embodiments of the present invention so as to hold the heat transferring block 10 inside that space.

However, the basic operation of each of the constituents is identical to that of the previous embodiments of the present invention.

To more clearly present the shape of the fin coupling portion 26 of the current embodiment of the present invention, only the heat transferring block 10 and the heat pipes 20 coupled to the heat transferring block 10 are illustrated in FIG. 24A.

FIGS. 26 and 27 illustrate an apparatus 1h for cooling the computer parts according to another embodiment of the present invention. Referring to FIGS. 26 and 27, the apparatus 1h for cooling the computer parts is identical to the apparatus 1g for cooling the computer parts in terms of a chipset mounted in the substrate 99 of a graphic adapter embedded in a main board of a computer, and the height of each of the heat pipes 20 from the substrate 99. However, the apparatus 1h for cooling the computer parts is different from the apparatuses 1 and 1g for cooling the computer parts in that the block coupling portion 22 indicated in virtual lines in FIG. 27 is not formed at both ends of each of the heat pipes 20 but in the center portion of each of the heat pipes 20. Both ends of the block coupling portion 22 extend to the connecting portion 24 and the other part of the heat pipe 20 forms the fin coupling portion 26 having a ring- or halfcircular arc shape. The fin coupling portion 26 of the current embodiment of the present invention is the same as that of the above previous embodiments of the present invention. Since the heat dissipating fins 30 surrounds the heat transferring block 10, they are relatively small and therefore, the center space is larger than those of the above previous embodiments of the present invention, just like that of the apparatus 1g for cooling the computers.

To more clearly present the shape of the fin coupling portion 26 of the current embodiment of the present invention, only the heat transferring block 10 and the heat pipes 20 coupled to the heat transferring block 10 are illustrated in FIG. 26A.

The apparatuses 1g and 1h for cooling the computer parts are used to cool the chipset mounted in the substrate 99 of the graphic adapter but not limited thereto. The apparatuses 1g and 1h for cooling the computer parts may be used to dissipate heat generated by the CPU if required.

The heights of the apparatuses 1g and 1h for cooling the computer parts are relatively low so that they can be useful in cases where their spaces are limited. Also, the apparatuses 1g and 1h for cooling the computer parts can be used to dissipate heat generating parts of a notebook computer. The constitution of other constituents of the current embodiment of the present invention can properly correspond to those of the above previous embodiments of the present invention.

FIGS. 28 and 29 illustrate an apparatus 1i for cooling computer parts according to another embodiment of the present invention. Referring to FIGS. 28 and 29, an external end of each of heat dissipating fins 30i has a wave shape. Although the apparatus 1i for cooling the computer parts is identical to those of the above previous embodiments of the present invention in that the heat dissipating fins 30i are made of a thin plate, the heat dissipating fins 30i extending to the outside of the fin coupling portion 26 of each of the heat pipes 20 have a bending wave shape. The exterior surface area of the wave-shaped heat dissipating fins 30i is wider than the heat dissipating fins 30 of the above previous embodiments of the present invention.

According to the current embodiment of the present invention, the heat dissipating fins 30i has a regular wave shape but not limited thereto. Although not shown, each of the heat dissipating fins 30i may have a rectilinear zigzag shape so that the surface area of the heat dissipating fins 30i can be increased.

FIGS. 30 and 31 illustrate an apparatus 1j for cooling computer parts according to another embodiment of the present invention. Referring to FIGS. 30 and 31, the apparatus 1j for cooling the computer parts comprises heat dissipating fins 30j including a duct portion. The apparatus 1a for cooling the computer parts comprises the duct member 50 (refer to FIGS. 6 and 8) as a separate member, whereas each of the heat dissipating fins 30j comprises duct forming portions 31j in which exterior ends are bent to substantially 90°. The heat dissipating fins 30j are spaced apart from each other and coupled to the fin coupling portion 26 so that the duct forming portions 31j are bent approximately perpendicular to the radial direction of the heat dissipating fins 30j, thereby forming the duct portion. The heat dissipating fins 30j has a cylindrical shape and forms the duct portion on the exterior surface of the heat dissipating fins 30. That is, the apparatus 1j for cooling the computer parts does not comprise a separate duct member but the duct portion formed by connecting the duct forming portions 31j of the heat dissipating fins 30.

According to the current embodiment of the present invention, the duct forming portions 31j are formed at two exterior ends of the heat dissipating fins 30j. However, according to the previous embodiments of the present invention, a groove is not formed at exterior ends of the heat dissipating fins 30j but the duct forming portions 31j can be integrally coupled to the heat dissipating fins 30j.

FIGS. 32 and 33 illustrate an apparatus 1k for cooling computer parts according to another embodiment of the present invention. Referring to FIGS. 32 and 33, the ends of each heat dissipating fins 30k at opposing ends of the axis of cooling fan C so that an airflow produced by the cooling fan 40 can maintain the spiral shape with respect to the axis of the cooling fan C.

If the cooling fan 40 rotates in an arrow direction, blades of the cooling fan 40 generate the airflow of the spiral shape in a counterclockwise direction. The air path formed between the heat dissipating fins 30k forms the spiral shape in the counterclockwise direction like the a direction of the airflow generated by the cooling fan 40 so that the spiral air produced by the cooling fan 40 can easily flow through the heat dissipating fins 30k. Such a constitution makes it possible to increase cooling efficiency.

To form the spiral air flow path between the heat dissipating fins 30k, each of the heat dissipating fins 30k has a 3-dimensional shape. More specifically, both ends of each of the heat dissipating fins 30k forwarding the upper stream of the airflow produced by the cooling fan 40 are bent in opposite directions with respect to a plane Pk that passes through the center portion of the heat dissipating fins 30 and the rotating center axis C of the cooling fan 40.

More specifically, referring to FIG. 33, the upper and bottom portions (the upper and bottom streams) of the heat dissipating fins 30k are bent to the left and right of the plane Pk that passes through the rotating center axis C and the center portion of one of the heat dissipating fins 30k.

FIG. 34 illustrates an apparatus 1m for cooling computer parts according to another embodiment of the present invention. Referring to FIG. 34, the apparatus 1m for cooling the computer parts is different from the previous embodiments of the present invention in terms of the shape of the fin coupling portion 26m of each of the heat pipes 20. According to the previous embodiments of the present invention, the fin coupling portion 26 forms a circular arc as a whole. However, according to the current embodiment of the present invention, the apparatus 1m for cooling computer parts comprises the block coupling portion 22 that is formed at both ends of each of the heat pipes 20, two fin coupling portions 26m extending from the block coupling portion 22 and a rectilinear portion 25 that connects the two fin coupling portions 26m.

Each of the fin coupling portions 26m forms a part of a semicircular or oval shape. The fin coupling portions 26m can have a running track shape. The heat dissipating fins 30 are spaced apart from each other and are arranged to extend radially from the fin coupling portions 26m. Also, the heat dissipating fins 30 are spaced apart from each other and are in parallel coupled to the rectilinear portion 25, in parallel.

To more clearly present the shape of the fin coupling portion 26m of the current embodiment of the present invention, only the heat transferring block 10 and the heat pipes 20 coupled to the heat transferring block 10 are illustrated in FIG. 34A.

The apparatus 1m for cooling the computer parts comprises two cooling fans 40, thus having a narrower profile in the axial direction of the fins. so that it is suitable for installation on a main board having limited space.

Although not shown, a virtual plane in which a fin coupling portion of each of heat pipes is formed according to another embodiment of the present invention is at acute angle to the upper surface of a heat transferring block. In this case, the apparatus for cooling the computer parts comprises a cooling fan. That is, according to the previous embodiments of the present invention, the virtual plane in which the fin coupling portion 26m is formed is at right angles to or parallel to the upper surface of the heat transferring block. However, the virtual plane in which the fin coupling portion of each of heat pipes is formed according to another embodiment of the present invention is at acute angle, i.e., an angle between 0° and 90°, to the upper surface of a heat transferring block. The acute angle may be approximately 30°~60°.

If the virtual plane in which the fin coupling portion is formed is tilted over, airflow produced by the cooling fan can cool heat generating parts to which the heat dissipating block is tightly adhered, and even other heat generating parts disposed around the component that the heat dissipating block is adhered.

A method of manufacturing an apparatus for cooling computer parts according to an embodiment of the present invention will now be described.

The apparatus for cooling the computer parts manufactured according to the current embodiment of the present invention comprises a heat transferring block, heat pipes, and a plurality of heat dissipating fins. The heat dissipating fins are spaced apart from each other and coupled to a curve type fin coupling portion of each of the heat pipes. This is a common characteristic of the apparatuses for cooling the computer parts according to the previous embodiments of the present invention.

The apparatus for cooling the computer parts according to the current embodiment of the present invention comprises the heat transferring block tightly coupled to heat generating parts to receive heat generated by the heat dissipating parts, at least one heat pipe including at least one block coupling portion thermally coupled to the heat transferring block and at least one fin coupling portion extending from the block coupling portion and forming a curve, and the plurality of heat dissipating fins coupled to the fin coupling portion of the heat pipe, a perforation portion through which the fin coupling portion of the heat pipe passes, and spaced apart from each other along to the fin coupling portion.

The method of manufacturing the apparatus for cooling the computer parts comprises providing at least one heat pipe formed in a rectilinear shape, wherein the heat pipe includes a first portion and a block coupling portion; providing a plurality of heat dissipating fins including perforation holes; inserting the first portion of the heat pipe into the heat dissipating fins through the perforation holes and arranging the heat dissipating fins to be spaced apart from each other; bending the first portion of the heat pipe on which the heat dissipating fins are disposed in order to form a fin coupling portion so that the fin coupling portion has a generally curved shape composed essentially of one or more circular arc portions; and engaging the block coupling portion to a heat transferring block capable of being thermally coupled to the heat generating computer parts to conduct the heat generated by the heat generating parts.

The method of manufacturing the apparatus for cooling the computer parts further comprises coating a cream solder on a part of the heat pipe that contacts with the perforation hole of each of the heat dissipating fins and heating the part where the cream solder is coated and forming a soldering portion that fixes the heat pipe to the heat dissipating fins.

The cream solder is coated before the fin coupling portion is formed, and the soldering portion is formed after the fin coupling portion is formed.

Referring to FIGS. 35 through 37, a method of manufacturing an apparatus for cooling computer parts according to an embodiment of the present invention will now be described.

The method comprises preparing a heat pipe 20 and a plurality of heat dissipating fins 30, inserting the heat dissipating fins into the heat pipe, coating a cream solder, forming a fin coupling portion 26, and forming a soldering portion.

When the heat pipe 20 and the heat dissipating fins 30 are prepared, the heat pipe 20 has a rectilinear shape, and perforation holes 32 (refer to FIG. 5A) are formed at the heat dissipating fins 30 in which the number of the perforation holes 32 is the same as that of the heat pipes 20. FIG. 35 shows the locations where the block coupling portion 22, a connecting portion 24, and the fin coupling portion 26 are disposed after the heat pipe 20 is formed.

Referring to FIG. 36, the heat dissipating fins 30 are inserted into the heat pipe 20 through the perforation holes 32 formed at the heat dissipating fins 30. Spacer portions 32 are formed at the exterior circumferential surface of the perforation holes 32 of the heat dissipating fins 30 so that if the heat dissipating fins 30 are sequentially inserted into the heat pipe 20 to form the fin coupling portion 26, the heat dissipating fins 30 are spaced apart from each other by a regular gap at the height of the spacer portions 32. Or, the heat dissipating fins 30 can be inserted into the heat pipe 20 at once after the perforation holes 32 are arranged in a straight line on the heat dissipating fins 30.

Next, the cream solder is coated in a part where the heat dissipating fins 30 contacts the heat pipe 20. The cream solder which is a toxic material is converted into a solid if heated and has a coupling force. There are various methods of coating the cream solder.

However, the cream solder is coated simultaneously with the insertion of the heat dissipating fins 30 into the heat pipe 20. More specifically, if the heat dissipating fins 30 are inserted into the perforation holes 32 and simultaneously with the coating of the cream solder around the heat pipe 20, the heat dissipating fins 30 are inserted into the heat pipe 20 coated with the cream solder, so that the insertion and the coating are simultaneously performed. The cream solder may be coated after the fin coupling portion 26 is formed if required.

According to the current embodiment of the present invention, after the cream solder is coated, the heat pipe 20 is bent in a ring or circular arc to form the fin coupling portion 26. Referring to FIG. 36, the heat pipe 20 into which the heat dissipating fins 30 are inserted is bent to form the fin coupling portion 26. The fin coupling portion 26 may be formed using a mechanical automatic equipment. Referring to FIG. 37, the connecting portion 24 and the block coupling portion 22 are formed after or simultaneously with forming the fin coupling portion 26 in the heat pipe 20.

Next, the soldering portion is formed. If the fin coupling portion 26 is formed after the cream solder is coated, heat is applied to the coated cream solder. The heated cream solder is penetrated between parts where the heat dissipating fins 30 contact the fin coupling portion 26. If the heat is removed from the cream solder, the cream solder is cooled to form a solid soldering portion 91, thereby firmly coupling the heat dissipating fins 30 and the heat pipe 20.

The method of manufacturing the apparatus for cooling the computer parts couples the heat dissipating fins 30 to the heat pipe 20 and forms the fin coupling portion 26 having the circular arc or ring shape, thereby easily coupling the heat dissipating fins 30 coupled to the heat pipe 20 to the curved fin coupling portion 26. Conventionally, since the heat dissipating fins 30 are inserted into the rectilinear heat pipe 20, the heat dissipating fins cannot be inserted into the curved heat pipe.

The method of the current embodiment of the present invention solders using the cream solder, the heat pipe 20 and the heat dissipating fins 30 can be easily and firmly coupled. The heat dissipating fins 30 include the spacer portion 32, so that the heat dissipation fins 30 can be spaced apart from each other by a constant gap.

The method of the current embodiment of the present invention sequentially preparing the heat pipe 20 and the heat dissipating fins 30, inserting the heat dissipating fins 30 into the heat pipe, coating the cream solder, forming the fin coupling portion 26, and forming the soldering portion but not limited thereto. That is, the cream solder is coated and the soldering portion is formed before or after the heat dissipating fins 30 are formed according to the shape of the heat dissipating fins 30.

The method of the current embodiment of the present invention is suitable for manufacturing the fin coupling portion 26 included in the apparatus for cooling the computer parts and the heat dissipating fins 30 coupled to the fin coupling portion 26. The apparatuses for cooling the computer parts of the previous embodiments of the present invention can be manufactured using the method of the current embodiment of the present invention.

The apparatus for cooling the computer parts according to an embodiment of the present invention can more effectively dissipate heat generated by heat generating parts using a heat pipe including a fin coupling portion and a plurality of heat dissipating fins coupled to the fin coupling portion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for cooling heat generating computer parts installed in a computer, the apparatus comprising:
   a heat transferring block thermally coupled to the heat generating parts to conduct the heat generated by the heat dissipating parts;
   at least one heat pipe, each including a block coupling portion thermally coupled to the heat transferring block and a fin coupling portion formed of a generally curved shape composed essentially of one or more circular arc portions;
   a plurality of heat dissipating fins, each having at least one perforation hole through which the fin coupling portion of the heat pipe passes through, wherein each of the heat dissipating fins are spaced apart from one another along the fin coupling portion and positioned on the fin coupling portion;
   least one heat pipe including two connecting portion, each of which has an upper end and a lower end; and
   the upper ends of the two connecting portions being connected to the fin coupling portion,
   wherein the two connecting portions cross each other when viewed in the direction of the axis which passes through the center of the circular arc portions of the fin coupling portion.

2. The apparatus of claim 1, wherein the two connecting portions are generally shaped as "J".

3. The apparatus of claim 1, wherein the fin coupling portion and the heat dissipating fins are affixed by soldering.

4. The apparatus of claim 1, further comprising: a cooling fan including a center axis and a center driving portion including a motor and a plurality of blade portions, wherein the plurality of blade portions are formed at the circumferential surface of the center driving portion and produce an air current during rotation;
   wherein the fin coupling portion substantially forms a circular arc shape and the heat dissipating fins form a cylindrical shape as a whole; and
   wherein each of the heat dissipating fins includes an end panel at the radially far end;
   wherein the end panel has a substantially rectangular shape and substantially blocks air from flowing out radially.

5. An apparatus for cooling heat generating computer parts installed in a computer, the apparatus comprising:
   a heat transferring block thermally coupled to the heat generating parts to conduct the heat generated by the heat dissipating parts;
   at least one heat pipe, each includincing a block coupling portion thermally coupled to the heat transferring block and a fin coupling portion formed of a generally curved shape composed essentially of one or more circular arc portions;
   a plurality of heat dissipating fins, each having at least one perforation hole throucih which the fin coupling portion of the heat pipe passes through, wherein each of the heat dissipating fins are spaced apart from one another along the fin coupling portion and positioned on the fin coupling portion;
   the at least one heat pipe including a first connecting portion and a second connecting portion, each of which has an upper end and a lower end;
   the upper ends of the two connecting portions being connected to the fin coupling portion; and
   the lower ends of the two connectinci portions being substantially horizontally connected to the block coupling portion which is immersed in the heat transferring block,
   wherein the distance from the upper end of the first connecting portion to the lower end of the first connecting portion is greater than the distance from the upper end of the first connecting portion to the lower end of the second connecting portion.

6. The apparatus of claim 1, wherein the fin coupling portion and the heat dissipating fins are affixed by soldering.

7. The apparatus of claim 1, further comprising: a cooling fan including a center axis and a center driving portion including a motor and a plurality of blade portions, wherein the plurality of blade portions are formed at the circumferential surface of the center driving portion and produce an air current during rotation; wherein the fin coupling portion substantially forms a circular arc shape and the heat dissipating fins form a cylindrical shape as a whole; and
   wherein each of the heat dissipating fins includes an end panel at the radially far end;
   wherein the end panel has a substantially rectanciular shape and substantially blocks air from flowing out radially.

* * * * *